United States Patent
Kurihara et al.

(10) Patent No.: US 7,161,793 B2
(45) Date of Patent: Jan. 9, 2007

(54) LAYER CAPACITOR ELEMENT AND PRODUCTION PROCESS AS WELL AS ELECTRONIC DEVICE

(75) Inventors: Kazuaki Kurihara, Kawasaki (JP); Takeshi Shioga, Kawasaki (JP); John David Baniecki, Kawasaki (JP); Mamoru Kurashina, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/706,288

(22) Filed: Nov. 13, 2003

(65) Prior Publication Data

US 2004/0130849 A1 Jul. 8, 2004

(30) Foreign Application Priority Data

| Nov. 14, 2002 | (JP) | 2002-330578 |
| Mar. 10, 2003 | (JP) | 2003-063558 |
| Mar. 31, 2003 | (JP) | 2003-094732 |

(51) Int. Cl.
*H01G 4/228* (2006.01)

(52) U.S. Cl. ............ 361/306.3; 361/303; 361/305; 361/311; 361/313; 361/321.2; 257/295; 257/296; 257/532

(58) Field of Classification Search ............ 361/307.1, 361/301.2, 311–313, 321.1, 321.2, 321.5, 361/306.1–306.3, 303–305, 321.4; 257/532–534, 257/295–296

See application file for complete search history.

(56) References Cited

U.S. PATENT DOCUMENTS 6,072,689 A * 6/2000 Kirlin .................. 361/311
6,326,671 B1 12/2001 Nagano et al.
6,737,728 B1 * 5/2004 Block et al. .............. 257/532
6,753,221 B1 * 6/2004 Jeon et al. ................ 438/253

FOREIGN PATENT DOCUMENTS

| EP | 0 911 871 A2 | 4/1999 |
| EP | 0 961 311 A2 | 12/1999 |
| JP | 7-111318 | 4/1995 |
| JP | 7-273297 | 10/1995 |
| JP | 9-293837 | 11/1997 |
| JP | 10-242393 | 9/1998 |
| JP | 11-126883 | 5/1999 |
| JP | 2000-49311 | 2/2000 |
| JP | 2000-68463 | 3/2000 |
| JP | 2000-156479 | 6/2000 |
| JP | 2000-228499 | 8/2000 |
| JP | 2002-280261 | 9/2002 |

* cited by examiner

*Primary Examiner*—Nguyen T. Ha
(74) *Attorney, Agent, or Firm*—Westerman, Hattori, Daniels & Adrian, LLP.

(57) ABSTRACT

In one aspect of the invention, in a thin layer capacitor element comprising a capacitor having a dielectric layer made of a metal oxide and a protective insulating layer made of a resin material, a barrier layer made of a non-conductive inorganic material is provided between the capacitor and the protective insulating layer. In another aspect of the invention, a thin layer capacitor element is constituted so that a capacitor structure is covered with at least one protective insulating layer composed of a cured resin, the cured resin being formed from at least one resin precursor selected from the group consisting of thermosetting resins, photosetting resins and thermoplastic resins.

12 Claims, 18 Drawing Sheets

LAYER CAPACITOR ELEMENT AND PRODUCTION PROCESS AS WELL AS ELECTRONIC DEVICE

CROSS-REFERENCE TO RELATED APPLICATIONS

This application is based upon and claims the benefit of priorities from the prior Japanese Patent Applications Nos.: 2002-330578, filed Nov. 14, 2002; 2003-63558, filed Mar. 10, 2003; and 2003-94732, filed Mar. 31, 2003; the entire contents of which are incorporated herein by reference.

BACKGROUND OF THE INVENTION

1. Field of the Invention

The present invention relates to a capacitor and, specifically, it relates to a thin layer capacitor element comprising a capacitor formed on a substrate, such as a semiconductor substrate, by a thin layer fabrication process. More particularly, the present invention relates to a thin layer capacitor element provided with a barrier layer, between a capacitor and a protective insulating layer, to inhibit a reduction of the metal oxide dielectric layer by moisture from the protective insulating layer. Further, the present invention relates to a thin layer capacitor element provided with an improved protective insulating layer to prevent absorption of water or moisture from the external environment while also preventing deterioration of electrical characteristics and short-circuits between electrodes. Furthermore, the present invention relates to a production process for the thin layer capacitor elements and to an electronic device having mounted thereon the thin layer capacitor element of the invention.

2. Description of Related Art

Recently, the increased processing speeds of LSIs have led to the development of decouple processing as a strategy for preventing diffusion of high-frequency noise, as well as a demand for an improved high-frequency tracking performance of the decoupling capacitors used therefor.

To achieve improved high-frequency tracking performance of decoupling capacitors, the decoupling capacitors must have characteristics such as high capacitance and low impedance connections in distributed circuits, and it is known that this requirement can be achieved by forming thin layer capacitors on a semiconductor substrate by a thin layer fabrication process. This is because the thin layer fabrication process allows microprocessing for the purpose of achieving lower inductance capacitors and to reduce the thicknesses of dielectric layers to increase the capacitance.

Thin layer capacitors are produced by a thin layer process in which a metal or metal oxide is deposited on a supporting substrate such as a silicon substrate. In order to realize large-capacitance capacitors, dielectric layers are formed using composite oxide dielectric materials having high dielectric constants. Also, precious metals such as platinum (Pt) or iridium (Ir) are used as the electrode materials for formation of electrode layers. This is because such electrode materials have excellent oxidation resistance suitable for the relatively high-temperature environments utilized for dielectric layer formation, while also allowing control of the crystal orientation of the dielectric materials.

Because the thin layer capacitors are miniature, have large capacities and are excellently suited for microprocessing, they allow connections with circuit boards to be formed as bump connections with narrow pitches between terminals, thereby reducing mutual inductance and making possible effective functioning for low-inductance connections with LSIs. However, as the miniature size and the large capacity of a thin layer capacitor is achieved by using a metal oxide as the dielectric material, the metal oxide undergoes reduction during the fabrication process and thereby produces deterioration in the characteristics.

In order to solve this problem of deterioration of dielectric materials, the following has been proposed, for example, in Japanese Unexamined Patent Publication (Kokai) No. 2000-49311.

FIGS. 1A to 1H show, in sequence, the production steps of a conventional production process of a thin layer capacitor described in the aforementioned patent publication.

First, as shown in FIGS. 1A and 1B, a lower electrode 2 made of platinum (Pt) is formed on a semiconductor substrate 1. Then, as shown in FIGS. 1C and 1D, a capacitive insulating layer 3 made of an insulating metal oxide and an upper electrode 4 made of platinum (Pt) are deposited thereover in that order.

This is followed by the etching step shown in FIG. 1E, and then, as shown in FIG. 1F, a protective insulating layer 6 is deposited on the upper electrode 4 so as to completely cover the upper electrode 4.

Next follows a resist mask-forming step for formation of a resist mask 9, as shown in FIG. 1G, and finally contact holes 9 are formed as shown in FIG. 1H through a dry etching step (not shown).

In the capacitor element produced upon the above process, the problem of reduction of the capacitive insulating layer due to hydrogen generated in the step of removing the resist mask 10 is prevented by such means as limiting the open area of the contact holes 9 of the protective insulating layer 6 to not more than 5 $\mu m^2$.

In the conventional thin layer capacitor described above with reference to FIGS. 1A to 1H, reduction of the insulating metal oxide of the capacitive insulating layer 3 is prevented by blocking it with a protective insulating layer 6. However, the thin layer capacitor generally employs bumps or similar high-precision packing-enabling connection forms for the terminals to thereby realize low inductance.

With this type of connection form, the mechanical stress generated by the difference in thermal expansion coefficients of the thin layer capacitor and the circuit board on which the thin layer capacitor is mounted can directly bear on the thin layer capacitor terminals, without being mediated by a buffer material such as a lead.

An internal capacitor composed of an extremely thin layer easily tends to undergo a problem such as interlayer peeling due to the aforementioned mechanical stress and, in order to avoid this problem, it is essential to use as the protective insulating layer a resin material such as polyimide which absorbs the mechanical stress from bumps, etc.

Such a solution, however, results in the following new problems.

As the first problem, there is the problem of reduction of the dielectric material in the step of forming the protective insulating layer. For example, a polyimide resin varnish forms a polyimide resin when cured at about 400° C. but, as the acid anhydride and diamine undergo dehydrating condensation polymerization to generate $H_2O$ during curing of the polyimide varnish as the protective insulating layer, the $H_2O$ decomposes to hydrogen ions and the hydrogen ions reach the dielectric material, thereupon reducing it.

This occurs because the $H_2O$ infiltrates the capacitor electrodes in a hydrogen ion state due to the catalytic effect of the platinum Pt composing the electrodes, and the hydrogen ions reach the interface between the electrodes and the dielectric material by diffusion, thereby resulting in oxygen loss of the dielectric material.

The second problem is a problem which occurs during actual use in the field, though this is not a problem of the production steps illustrated in the prior art process.

This problem occurs due to the moisture absorption property of the resin material whereby, due to the high temperature surrounding the thin layer capacitor, moisture in the air absorbed by the polyimide resin migrates to the internal capacitor at a high temperature and reduces the dielectric material.

In addition to the above problems, the conventional production processes suffer from other problems.

For conventional production processes, the thin layer capacitor elements, as are well known, are produced by forming a lower electrode layer, a dielectric layer and an upper electrode layer in that order on a silicon substrate. Further, assuming that flip chip connections created with solder bumps are applied, it is common to first form a capacitor structure comprising a lower electrode layer, a dielectric layer and an upper electrode layer, and then form solder bumps for electrical connections between the upper electrode layer and lower electrode layer. Another common practice is to employ an organic resin material such as a photosensitive polyimide to form a protective insulating layer for the capacitor structure, prior to the bump-forming step.

In the bump-forming step, contact holes are formed in the protective insulating layer in a predetermined pattern, and then a barrier metal such as Cr, Ti, Cu or Ni is applied to cover the inner walls of the contact holes in order to improve the solder wettability and to prevent diffusion of solder to the underlying metal (capacitor electrode) due to the heat in this step and prevent the reaction which results from such diffusion. A layer is then formed by plating of a metal material (for example, Cu) which serves the role as a connection plug for the upper electrode layer and lower electrode layer. Finally, a solder layer is formed by plating to form the desired solder bumps. Here, the resin material for the insulating protective layer also functions as a buffer layer against the electrodes, in order to alleviate the stress of the barrier metal which propagates to the capacitor electrodes.

However, thin layer capacitor elements produced in this manner are often exposed to a reducing atmosphere in the solder reflow step or undergo absorption of water or moisture from the external environment, leading to problems such as deterioration of the electrical characteristics of the dielectric substance and short-circuiting between the upper electrode layer and lower electrode layer. Particularly when platinum (Pt) is used as the electrode material, Pt readily allows penetration of hydrogen, a problem which is exacerbated by generation of hydrogen due to the catalytic effect on water.

Methods have already been proposed for avoiding the problems described above. In the case of FRAM (Ferroelectric Random Access Memory), for example, it has been proposed to cover the capacitor surface with a thin layer of an aluminum, silicon or titanium nitride as a protective layer to prevent penetration and diffusion of reducing gases such as hydrogen (see, Japanese Unexamined Patent Publication (Kokai) No. 7-111318). Another proposed solution has been to use organometallic compounds (silicon alkoxides) that react with water and harden, as protective layers to prevent deterioration of characteristics by water absorption (see, Japanese Unexamined Patent Publication (Kokai) No. 7-273297).

The prior art protective layers mentioned above have been effective for capacitor elements incorporated into semiconductor devices such as FRAMs, but in cases where flip chip connections are created with solder bumps as stand-alone capacitors, no alleviation in the stress from the solder bumps can be expect d and therefore it has not been possible to completely eliminate the problem of deterioration in the characteristics.

On the other hand, for thin layer capacitor elements having structures which allow flip chip connections, it has also been proposed to use organic resin materials such as photosensitive polyimide resins as protective layers (see, Japanese Unexamined Patent Publication (Kokai) No. 2002-280261). However, with photosensitive polyimide resins, the acid anhydride and diamine undergo dehydrating condensation polymerization during thermosetting, thereby generating water. Specifically, the polyimide precursor used as the starting substance comprises an acid anhydride and diamine which form polyamic acid, as represented by the following chemical formula, for example.

[Polyamic acid]

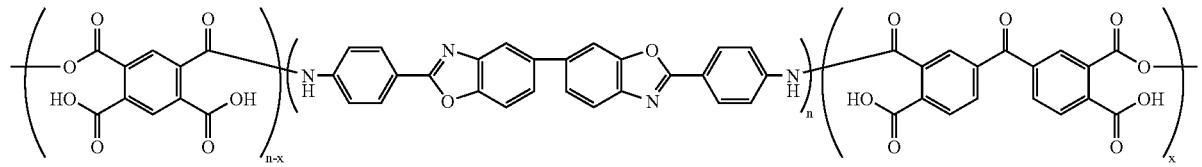

Moreover, polyimide precursors are generally sold in the state of liquid (varnish) comprising polyimide precursors dissolved in a solvent. The varnish is applied onto the substrate by spin coating or the like to form the protective layer. The resulting coating of the polyimide precursor is then heated at a temperature of, for example, 350 to 400° C. for thermosetting. The thermosetting reaction induces dehydrating condensation polymerization between the acid anhydride and diamine, resulting in ring closure reaction and release of water ($H_2O$), during formation of a thermoset polyimide represented by the following formula.

[Thermoset polyimide]

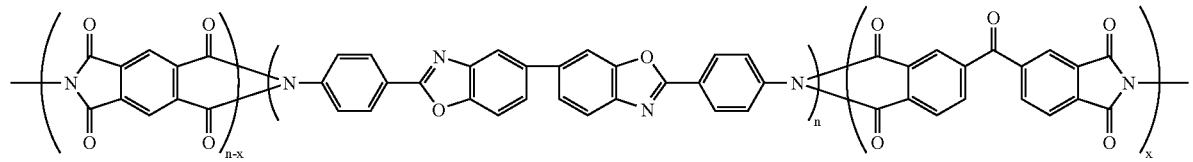

However, the water generated by the above protective layer-forming reaction can cause a major problem in that it impairs the characteristics of the obtained thin layer capacitor element. This occurs because the water released during the protective layer formation is able to contact the electrode layer (for example, Pt) which is formed adjacent to the protective layer. When water contacts the electrode layer, the catalytic effect of the Pt promotes infiltration of the hydrogen atoms of the water into the electrode layer, producing an oxygen deficiency in the dielectric oxide at the interface between the dielectric layer and the electrode layer. This oxygen deficiency can have a major influence on the dielectric and leak current characteristics of the thin layer capacitor element. FIGS. 2 and 3 are graphs illustrating such problems as occur when using a photosensitive polyimide resin as a protective layer of the thin layer capacitor, and they plot the C-V (electrostatic capacitance—applied voltage) characteristic curve and D-V (dielectric loss—applied voltage) characteristic curve, before and after formation of the protective layer with the photosensitive polyimide resin, respectively. In each of the graphs, curve I is the characteristic curve before formation of the polyimide resin-based protective layer, and curve II is the curve after formation of the polyimide resin-based protective layer. The thin layer capacitor elements produced for evaluation of the characteristics were obtained by forming the lower electrode layer and upper electrode layer both from platinum (Pt) according to conventional methods and forming the dielectric layer of a dielectric oxide $(Ba,Sr)TiO_3$ (hereinafter also referred to as BST), on a silicon substrate. The polyimide protective layer was formed by spin coating a photosensitive polyimide resin varnish for 30 seconds at 3,000 rpm, for example, at a thickness of 4 μm. The polyimide resin coating was then heated (prebaked) for 10 minutes at a temperature of 60° C. and then subjected to exposure and developing steps and heated (main baking) for 2 hours at a temperature of 400° C. This produced a 2 μm thick polyimide resin-based protective insulating layer. As seen in FIGS. 2 and 3, after forming the protective layer of the polyimide resin, an obvious abnormality in the characteristic was observed due to changes in the dielectric oxide, and the dielectric loss increased.

SUMMARY OF THE INVENTION

It is therefore an object of the present invention to provide a thin layer capacitor element which solves the problems related to reduction of the dielectric material which occurs when a resin material such as polyimide is used as a protective insulating layer to absorb the mechanical stress from bumps, and which has excellent high-frequency tracking performance and low deterioration of characteristics.

It is another object of the invention to increase an adhesion strength between a substrate such as a semiconductor substrate and a capacitor, particularly a lower electrode of the capacitor element, while limiting the number of sputtering apparatuses required for fabrication and to thereby keep the production costs to a minimum.

In addition to the above objects, the object of the invention is to provide a thin layer capacitor element which undergoes no deterioration in characteristics by water generated during resin curing for formation of the protective layer and which therefore requires no barrier layer.

Further, the object of the invention is to provide a thin layer capacitor element which can prevent absorption of water and moisture from the external environment while also preventing deterioration of electrical characteristics and shorts between electrodes.

Furthermore, the object of the invention is to provide a production process for these thin layer capacitor elements.

For example, the object of the invention is to provide a production process whereby a thin layer capacitor element, which can prevent absorption of water and moisture by the element while avoiding the problems of deterioration of characteristics and shorts between electrodes, may be produced with a high level of reliability and at a high yield.

Moreover, the object of the invention is to provide a high performance electronic device comprising the thin layer capacitor element of the invention, such as those exhibiting none of the problems of water or moisture absorption by the element and the consequent deterioration in characteristics or short-circuiting between electrodes.

These and other objects of the invention will be readily apparent from the detailed description which follows.

Introduction of Barrier Layer:

In one aspect thereof, the invention provides a thin layer capacitor element comprising a capacitor with a dielectric layer made of a metal oxide and at least one protective insulating layer made of a cured resin material such as polyimide resin, in which a barrier layer made of a non-conductive inorganic material is inserted between the capacitor and the protective insulating layer. The capacitor is preferably a capacitor structure comprising a dielectric layer, made of a metal oxide, sandwiched between a lower electrode layer and an upper electrode layer.

Further, the thin layer capacitor element of the invention preferably comprises a supporting substrate having formed thereon a capacitor with a dielectric layer made of a metal oxide, in which a barrier layer made of a non-conductive inorganic material covers at least the top and side of the capacitor, and at least one protective insulating layer made of a cured resin is formed on the barrier layer.

In these thin layer capacitor elements, the protective insulating layer and the internal capacitor are physically separated by the barrier layer. Thus, moisture released from the resin material of the protective insulating layer is prevented from reaching the metal oxide layer constituting the dielectric layer of the capacitor.

As a result, it is possible to use as the protective insulating layer a cured resin material such as polyimide which absorbs mechanical stress from the bumps, while preventing reduction of the metal oxide dielectric layer material due to moisture released from the resin material.

Furthermore, in the thin layer capacitor element of the invention, the barrier layer preferably has the same composition as that of the dielectric layer.

In this thin layer capacitor element, the composition of the material constituting the barrier layer is the same as the composition of the material constituting the dielectric layer, thereby allowing satisfactory layer adhesion to be guaranteed. Also, it is possible to obtain a thin layer capacitor having high reliability for the bonding surface between the dielectric layer and the barrier layer against mechanical stress (that is, the bonded layers are resistant to problems such as peeling).

Moreover, in the thin layer capacitor element of the invention, the barrier layer is preferably amorphous.

This enables to achieve a high reduction resistance in the barrier layer.

A crystallized metal oxide is used as the material for the dielectric layer in order to obtain a high dielectric constant. However, since gaps exist between the individual crystal grains of the crystals, migration of hydrogen ions in the crystals is facilitated. It is therefore effective to use an amorphous material, which is resistant to hydrogen ion migration, as a barrier layer to prevent the hydrogen ion migration, and a very high blocking effect against hydrogen ions can be achieved by a construction using such a material.

In addition, in the thin layer capacitor element of the invention, the terminals for external electrical connection are preferably provided at least at a location other than the edge of one side of the package.

According to this construction of the capacitor element, it is possible to reduce the spaces between terminals by forming the terminals at desired locations at the center of the package, even when the capacitor inside the thin layer capacitor has a large form.

That is, it is possible to provide a thin layer capacitor element having large capacitance and allowing low inductance connections.

Further, in the thin layer capacitor element of the invention, a plurality of capacitors (or capacitor structures) with different capacitances are preferably provided in a single thin layer capacitor element.

According to this construction of the capacitor element, for example in cases where a plurality of capacitors with different capacitances are necessary, the plurality of capacitors can be mounted as a single package instead of separately, thereby permitting more efficient use of the mounting area on the circuit board onto which the thin layer capacitor is to be mounted.

Moreover, it is also possible to lower part costs and reduce the number of mounting steps in the part mounting process.

In addition, the invention provides a process for production of a thin layer capacitor element comprising a capacitor with a dielectric layer made of a metal oxide and at least one protective insulating layer made of a cured resin, which comprises the steps of:

forming a capacitor;
forming a barrier layer, from a non-conductive inorganic material, on the capacitor; and
forming at least one protective insulating layer situated on the barrier layer so that the capacitor and the protective insulating layer is separated from the barrier.

Moreover, the invention provides a production process of thin layer capacitor element which comprises the steps of:

forming a capacitor with a dielectric layer, from a metal oxide, on a supporting substrate;
forming a barrier layer, from a non-conductive inorganic material, to cover at least the top and side of the capacitor; and
forming at least one protective insulating layer, from a cured resin, on the barrier layer so that the capacitor and the protective insulating layer is separated from the barrier layer.

According to these production processes, the interior of the protective insulating layer and the capacitor are physically separated by the barrier layer. That is, moisture released from the resin material of the protective insulating layer is prevented from reaching the metal oxide layer composing the dielectric layer of the capacitor.

As a result, it is possible to produce a thin layer capacitor element which employs as the protective insulating layer a resin material such as polyimide which absorbs mechanical stress from the bumps, while preventing reduction of the metal oxide dielectric layer material due to moisture released from the resin material.

In addition, according to one embodiment of the invention, the barrier layer and the adhesion layer are preferably made of the same material composition, thus providing an advantage whereby the number of sputtering apparatuses used for fabrication of the thin layer capacitor element may be reduced to a minimum.

Also, forming the adhesion layer from a material containing as a main component alumina or BST in an amorphous state provides an additional advantage whereby satisfactory adhesion can be achieved between the supporting substrate made of $SiO_2$ or Si and the lower electrode made of Pt or Au.

As the barrier layer serves as a barrier against hydrogen and water, it is, of course, effective even in structures having a non-resin protective insulating layer or structures having no protective insulating layer.

Improvement of Protective Insulating Layer:

According to another aspect of the invention, there is provided a thin layer capacitor element comprising a substrate having formed thereon a capacitor, preferably a capacitor structure comprising a dielectric layer sandwiched between a lower electrode layer and an upper electrode layer, in which the top of the capacitor is covered with at least one protective insulating layer composed of a cured resin, and the curing resin is formed from at least one resin precursor selected from the group consisting of thermosetting resins, photosetting resins and thermoplastic resins.

In this thin layer capacitor element, a barrier layer comprising a non-conductive inorganic material may be further provided between the capacitor and the protective insulating layer.

According to the invention, there is also provided a process for the production of a thin layer capacitor element comprising a substrate having formed thereon a capacitor, preferably, a capacitor structure constituted from a dielectric layer sandwiched between a lower electrode layer and an upper electrode layer, which comprises the steps of:

forming a capacitor on a substrate;
applying at least one resin precursor, selected from the group consisting of thermosetting resins, photosetting resins and thermoplastic resins, on the capacitor, particularly an upper electrode layer thereof; and
curing the resin precursor to form at least one protective insulating layer.

In addition, according to the invention, there is also provided an electronic device which comprises at least one electronic element and at least one thin layer capacitor element according to the invention.

As explained above and further explained in detail below, the invention is characterized in that a specific cured resin is laminated on a capacitor structure serving as the central part of the thin layer capacitor element, instead of a polyimide resin or other resin, which has been associated with problems in terms of water or moisture absorption properties, to form an insulating protective layer, and in that the protective insulating layer is directly laminated on the capacitor structure without inserting a water-resistant layer such as a barrier layer between the capacitor structure and the insulating protective layer. As the specific cured resin used to form the protective insulating layer of the invention releases no water, or generates only a very small amount of water, during its curing or drying, it is possible to prevent hydrogen-induced reductive degradation (generation of oxygen loss) of the dielectric oxide such as BST forming the dielectric layer.

FIG. 4 is a graph showing combined plots of the C-V (electrostatic capacitance—applied voltage) characteristic and D-V (dielectric loss—applied voltage) characteristic, similar to the characteristic curves in FIGS. 2 and 3 referred to above, for a thin layer capacitor element according to the invention employing a specific epoxy resin as the protective layer. This graph shows the results obtained from the characteristic evaluation test of Example 1 below, wherein curves I(C) and II(C) respectively represent the C-V characteristic before and after formation of the epoxy resin-based protective layer, while curves I(D) and II(D) respectively represent the D-V characteristic before and after formation of the epoxy resin-based protective layer. As will be understood from the four curves shown in FIG. 4, virtually no change in the element characteristics is seen before and after application of the epoxy resin, in contrast to the cases shown in FIGS. 2 and 3. These notable results may be explained as follows. The epoxy ring is highly reactive due to its high degree of strain and readily undergoes ring-opening addition reaction with nucleophilic species, thereby being cured (high molecularized and crosslinked). As the epoxy resin generates no water during curing, it is possible to avoid water-dependent hydrogen generation at the Pt electrode.

By using such a protective insulating layer according to the invention in a thin layer capacitor element, it is possible to prevent infiltration of hydrogen at the electrode/dielectric interface, thereby inhibiting deterioration of the characteristics of the dielectric material and contributing to improved reduction resistance and moisture resistance of the thin layer capacitor element.

DESCRIPTION OF THE PREFERRED EMBODIMENTS

Figure 1A:
FIGS. 1A to 1H are cross-sectional views showing, in sequence, the steps for carrying out the prior art production for a thin layer capacitor element.
Figure 1B:
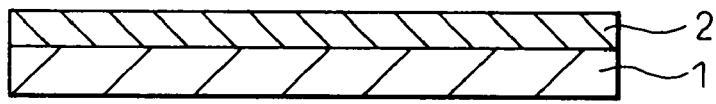
Figure 1C:
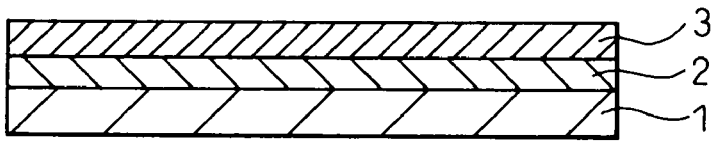
Figure 1D:
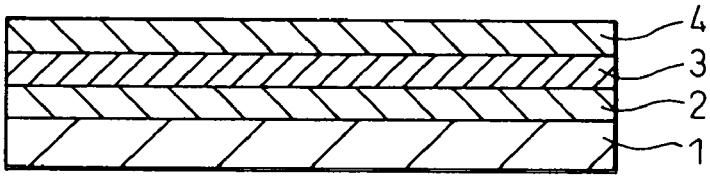
Figure 1E:
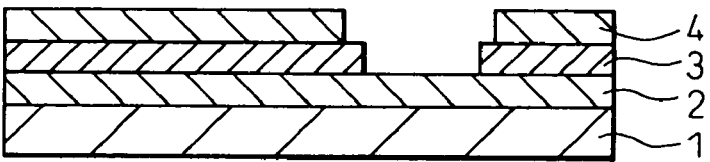
Figure 1F:
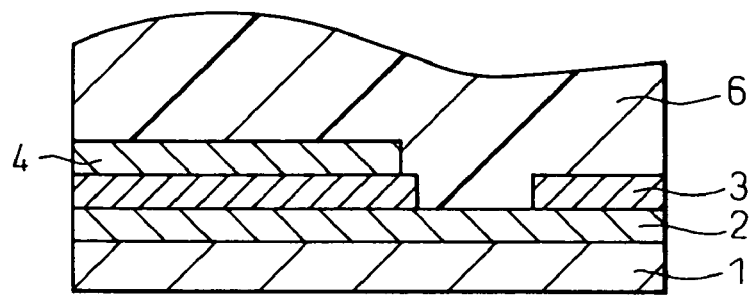
Figure 1G:
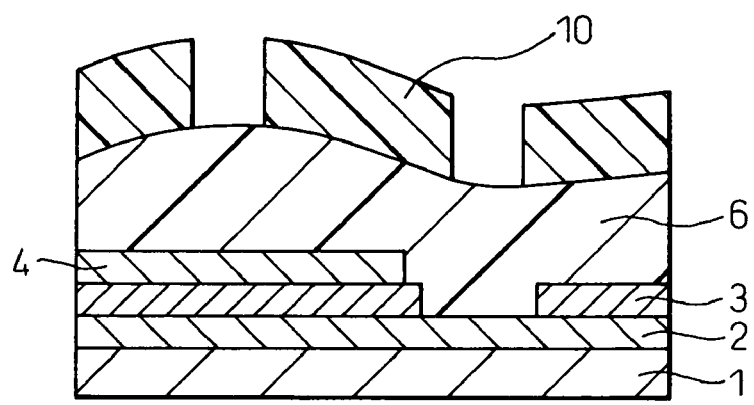
Figure 1H:
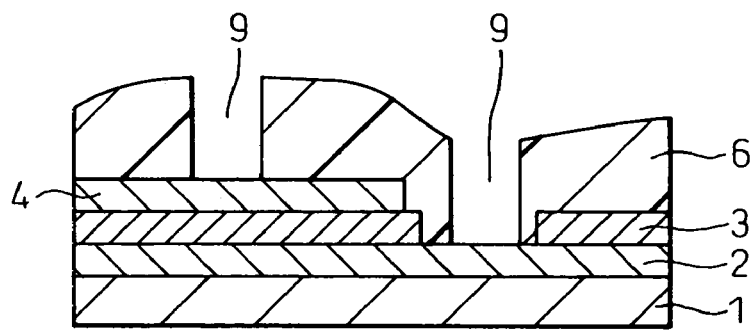
Figure 2:
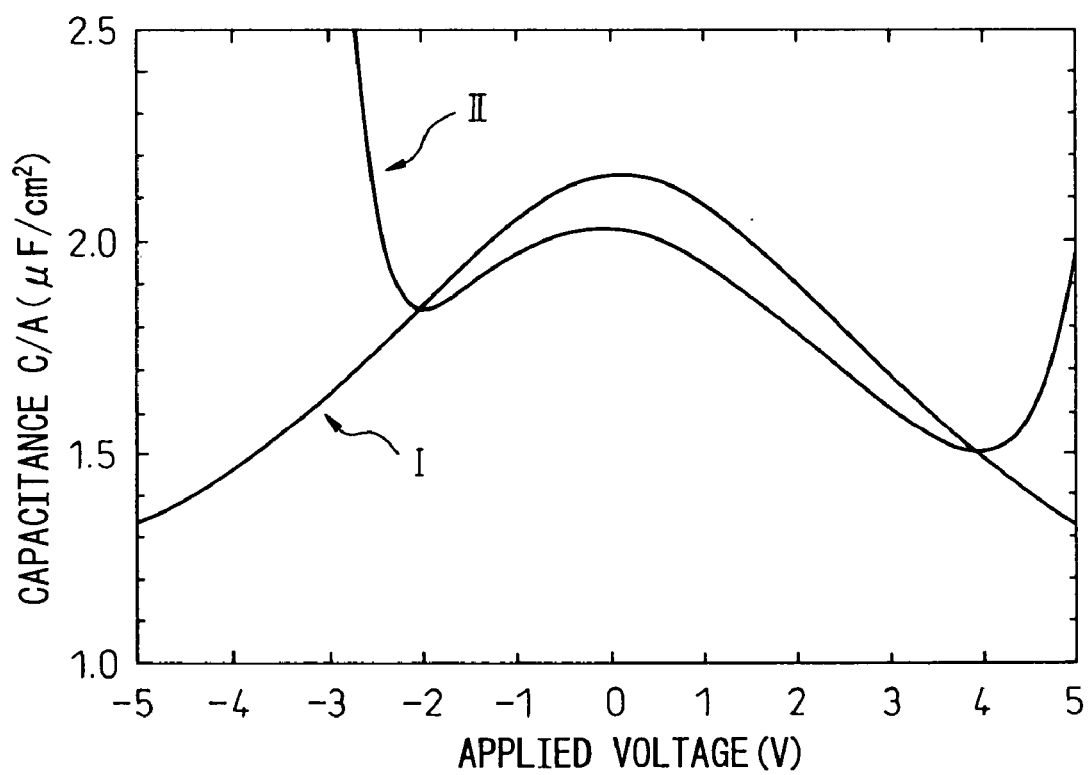
FIG. 2 is a graph showing a plot of the C-V (electrostatic capacitance—applied voltage) characteristic obtained using a polyimide resin in the prior art thin layer capacitor element.
Figure 3:
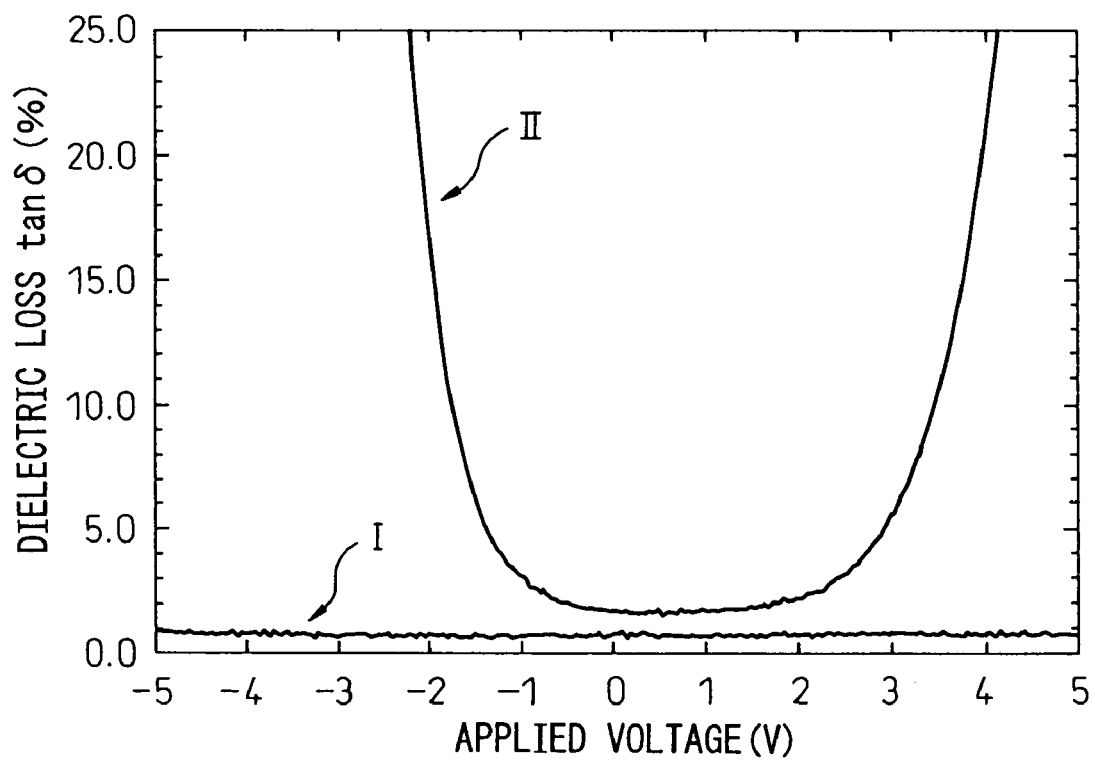
FIG. 3 is a graph showing a plot of the D-V (dielectric loss—applied voltage) characteristic obtained using a polyimide resin in the prior art thin layer capacitor element.

Preferred embodiments of the invention will now be explained with reference to the attached drawings with regard to each of the first and second aspects of the invention. Note, however, that the invention is not limited to these embodiments and may incorporate various improvements and modifications within the scope of the invention.

First Aspect of the Invention:

(First Embodiment)

A thin layer capacitor element according to a first embodiment of the present invention will now be explained with reference to FIG. 5 and FIGS. 6A to 6J showing, in sequence the production process of the thin layer capacitor element.

(1) Capacitor-forming Step

As shown in FIGS. 6A to 6D, a lower electrode layer 12 composed of platinum, a dielectric layer 13 composed of a composite oxide and an upper electrode layer 14 composed of platinum Pt are formed in that order on a silicon substrate 11 prepared as the supporting substrate, to form a capacitor 30 which is also referred herein to as a "capacitor structure".

A metal oxide (such as BST) with a high dielectric constant is used herein as the material for the dielectric layer 13 to achieve downsizing and large capacitance.

Further, a precious metal such as platinum (Pt) or iridium (Ir), having excellent oxidation resistance in high temperature environments and allowing satisfactory crystal orientation control during formation of the dielectric layer 13, is used as the material for the electrodes (the lower electrode layer 12 and upper electrode layer 14) of the capacitor 30.

Particularly, the series of production steps may be carried out in the following manner.

Figure 6A:
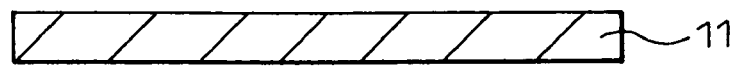
FIGS. 6A to 6J are cross-sectional views showing, in sequence, the steps of a production process for a thin layer capacitor element according to the first embodiment of the invention.
Figure 6B:
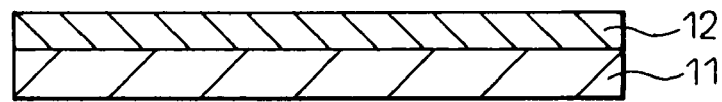

For the step of forming the lower electrode layer 12 shown in FIG. 6B, first a silicon wafer is used as the silicon substrate 11, and a sputtering method is used to form films of titanium oxide ($TiO_2$; 20 nm) and platinum (Pt; 100 nm) in that order on the silicon wafer. The titanium oxide ($TiO_2$; 20 nm) can serve the role of an adhesion layer between the silicon (Si) and platinum (Pt).

In this step, the sputtering conditions for the titanium oxide ($TiO_2$) are a substrate temperature of 500° C., an RF power of 200 W, a gas pressure of 0.1 Pa and an Ar/$O_2$ ratio of 7/1.

Further, the sputtering conditions for the platinum (Pt) are a substrate temperature of 400° C., a DC power of 100 W and a gas pressure of 0.1 Pa.

Figure 6C:
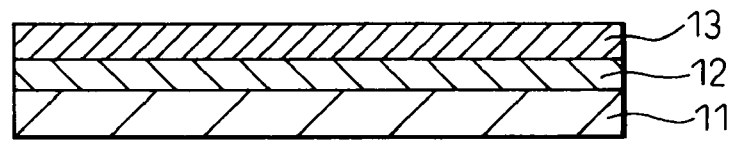

In the step of forming the dielectric layer 13 shown in FIG. 6C, an oxide ($Ba_x$, $Sr_{1-x}$)$TiO_3$ (hereinafter referred to as "BST") comprising barium Ba, strontium (Sr) and titanium (Ti) is used as the dielectric layer 13, and the BST layer is formed by a sol-gel method. The BST material is a material with a relatively large dielectric constant of 1500 as bulk, and thus it is effective for realizing a miniature capacitor with large capacitance.

Specifically, an alkoxide starting solution is first used to form a BST layer by spin coating (2000 rpm/30 seconds). An approximately 100 nm thick film is obtained by one spin coating step under these spin coating conditions.

The BST is then crystallized by prebaking for 10 minutes at a temperature of 400° C. and main baking for 10 minutes at a temperature of 700° C., thereby forming a BST layer with a thickness of 100 nm, a dielectric constant of 300 and a dielectric loss of not more than 2%.

Figure 6D:
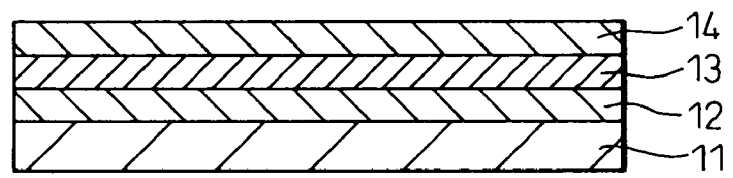

The same sputtering method as that described above is used in the step of forming the upper electrode layer 14 shown in FIG. 6D to form a platinum Pt layer at a thickness of 100 nm as the upper electrode layer 14 on the BST dielectric layer 13.

Figure 5:
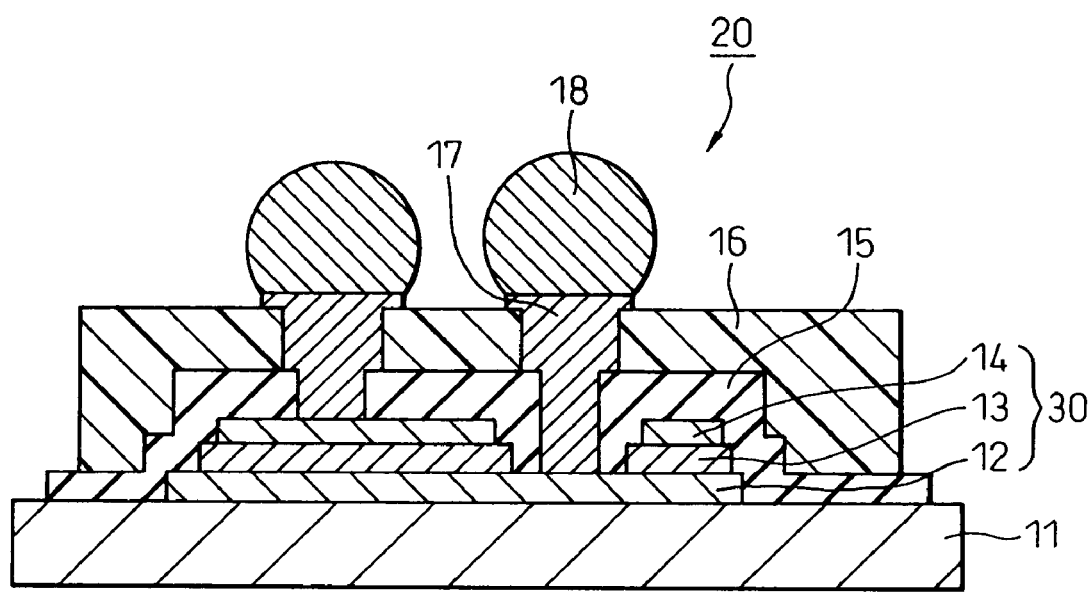
FIG. 5 is a cross-sectional view of a thin layer capacitor element according to the first embodiment of the invention.

It is noted that, as shown in FIG. 5, the sides of the capacitor 30 are formed in a stepwise fashion such that the edges of the lower layer extend outward beyond the edges of the upper layer.

By providing such stepwise extending sections, it is possible to stop fragments at the extending sections when fragments (particles) of the platinum material are produced during the fabrication process, thereby preventing adhesion of the fragments onto the sides of the dielectric layer and avoiding shortcircuits between the electrodes.

(2) Lower Electrode Connection-forming Step

Figure 6E:
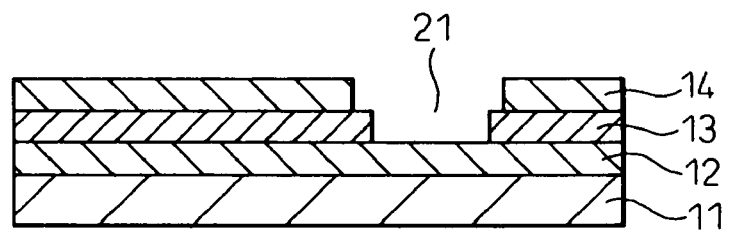

An electrode connection-forming hole 21 from the lower electrode layer 12 is formed in the manner shown in FIG. 6E.

Specifically, a resist mask is formed by photolithography, and then the Pt of the upper electrode layer 14 and the BST of the dielectric layer 13 are dry etched in that order by argon Ar ion milling.

(3) Barrier Layer-forming Step

Figure 6F:
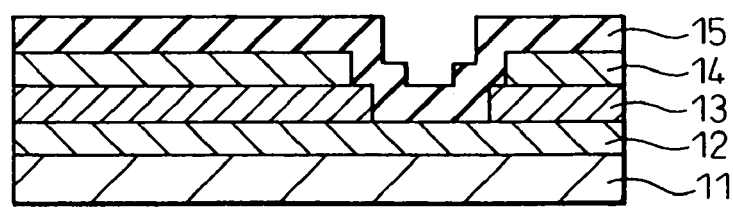

Next, as shown in FIG. 6F, a barrier layer 15 is formed so as to cover the capacitor 30 (both the top and side thereof).

Specifically, silicon nitride ($Si_3N_4$) used as the material for the barrier layer 15 is formed at a thickness of about 150 μm by a sputtering method. As alternatives to silicon nitride $Si_3N_4$ for the material of the barrier layer 15, there may also be used aluminum oxide ($Al_2O_3$), silicon oxide ($SiO_2$) or the like.

The sputtering conditions applied herein are a substrate temperature of 200° C., an RF power of 500 W, a gas pressure of 0.1 Pa and an $Ar/N_2$ ratio of 5/1.

As described above, aluminum oxide ($Al_2O_3$), silicon oxide ($SiO_2$), silicon nitride ($Si_3N_4$) and the like may be used as non-conductive inorganic materials for the barrier layer 15. However, the material used herein preferably has a thermal expansion coefficient equivalent to that of the dielectric layer 13 in order to avoid problems such as interlayer peeling that occur due to mechanical stress under exposure to severe temperature fluctuations in the field.

If the thermal expansion coefficient of the material constituting the barrier layer 15 and the thermal expansion coefficient of the material constituting the dielectric layer 13 are equivalent, it becomes possible to prevent peeling and the like due to warping between layers caused by differences in thermal expansion coefficients, and to obtain a thin layer capacitor with high reliability.

Further, the material of the barrier layer 15 is preferably of the same composition as the material of the dielectric layer 13 of the capacitor, in order to achieve satisfactory adhesion with the dielectric layer 13 of the capacitor.

By using the same composition for the material constituting the barrier layer 15 as the composition of the material constituting the dielectric layer 13, it becomes possible to guarantee satisfactory layer adhesion. Furthermore, it becomes possible to obtain a thin layer capacitor element 20 having high reliability for the bonding surface between the dielectric layer 13 and the barrier layer 15 against mechanical stress.

Furthermore, the material of the barrier layer 15 is preferably an amorphous material.

Generally, a crystallized metal oxide is used for the dielectric layer 13 in order to obtain a high dielectric constant. However, as gaps exist between the individual crystal grains of the crystals, migration of hydrogen ions in the crystals is facilitated. It is therefore effective to use an amorphous material, which is resistant to hydrogen ion migration, as the barrier layer 15 to prevent such hydrogen ion migration. A high blocking effect against hydrogen ions can be achieved by a construction using such a material.

(4) Protective Insulating Layer-forming Step

Figure 6G:
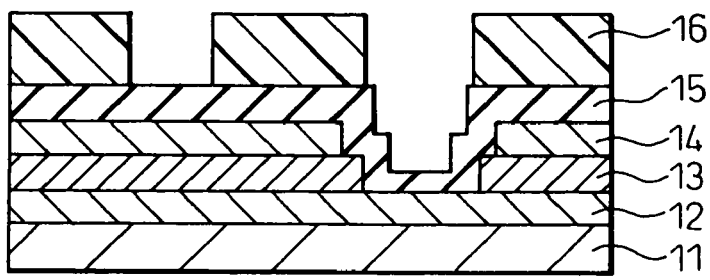

A protective insulating layer 16 made of for example a polyimide resin is formed over the barrier layer 15 as shown in FIG. 6G.

First, a photosensitive polyimide varnish is spin coated at 3000 rpm for 30 seconds to form a 4 μm thick layer. This is followed by heating (prebaking) for 10 minutes at a temperature of 60° C. and then by exposure and development steps and heating (main baking) for 2 hours at a temperature of 400° C. to form a 2 μm thick polyimide (PI) film 16.

(5) Contact Hole-forming Step

Figure 6H:
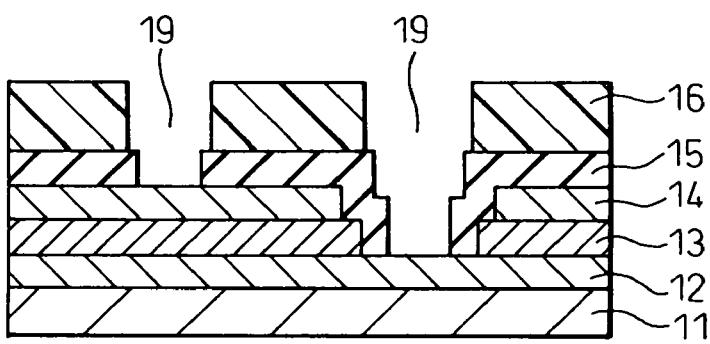

Contact holes 19 are formed as shown in FIG. 6H to expose the lower electrode layer 12 and upper electrode layer 14.

Specifically, a resist mask (not shown) is formed by photolithography, and then the silicon nitride ($Si_3N_4$) film is dry etched by argon Ar ion milling to expose the top of the capacitor and the lower electrode layer.

(6) Electrode Pad- and Bump-forming Step

Figure 6I:
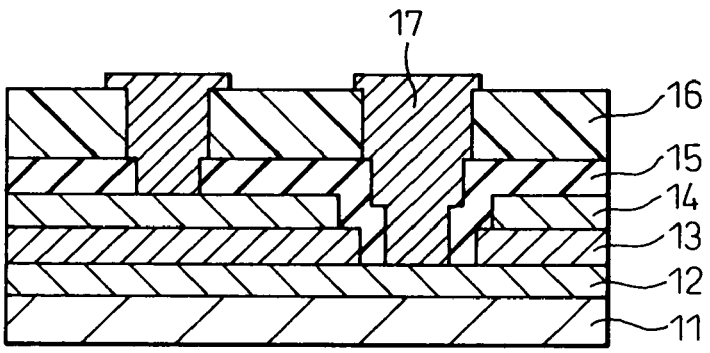
Figure 6J:
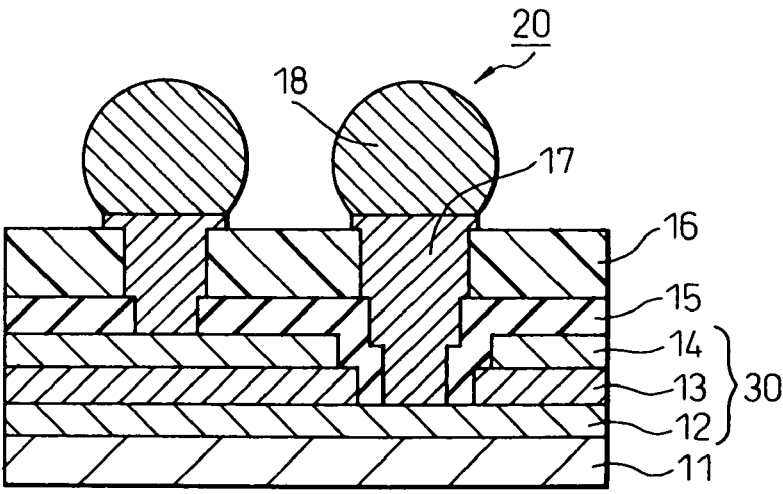

As shown in FIG. 6I, electrode pads 17 for connection of bumps with each electrode of the capacitor 30 are formed by sputtering and plating as under bump metals (UBM). Finally, as shown in FIG. 6J, bumps 18 are formed on the previously formed electrode pads 17 as terminals for electrical connection with a circuit board.

It is noted that solder is generally used as the material for the bumps 18, but solder materials can diffuse into the electrode pads 17 and react with the platinum (Pt) of the electrode layers, thereby altering the resistance value of the platinum. For this reason, the material for the electrode pads 17 is preferably chromium (Cr), titanium (Ti), copper (Cu), nickel (Ni) or the like from the standpoint of avoiding the aforementioned solder corrosion and improving the solder wettability.

The thin layer capacitor element 20 shown in FIG. 5 is thus formed by the production process described above.

In the thin layer capacitor element 20 of FIG. 5, the polyimide resin (protective insulating layer 16) which is hygroscopic and releases moisture under prescribed conditions is physically separated from the capacitor 30. That is, as moisture released from the polyimide resin is blocked before it reaches the catalytic electrode while in a non-ionized state, the moisture released from the polyimide resin is prevented from reaching a surface of the platinum (Pt; upper electrode layer 14) having a capacitor function.

Consequently, the problem of reduction of the metal oxide of the dielectric layer 13 at the interface between the upper electrode layer 14 and the dielectric layer 13 is avoided.

A resin material such as polyimide which absorbs mechanical stress from bumps can therefore be used as a resin material of the protective insulating layer 16, while preventing reduction of the metal oxide dielectric layer material by moisture released from the resin material. As a result, it is possible to provide a thin layer capacitor element 20 with excellent high-frequency tracking performance and low deterioration of characteristics.

[Comparative Experiment on Capacitor Characteristics]

The following is a comparative experimental result of the capacitor characteristics of thin layer capacitor elements, one using a barrier layer 15 and the other using no barrier layer 15.

Figure 7:
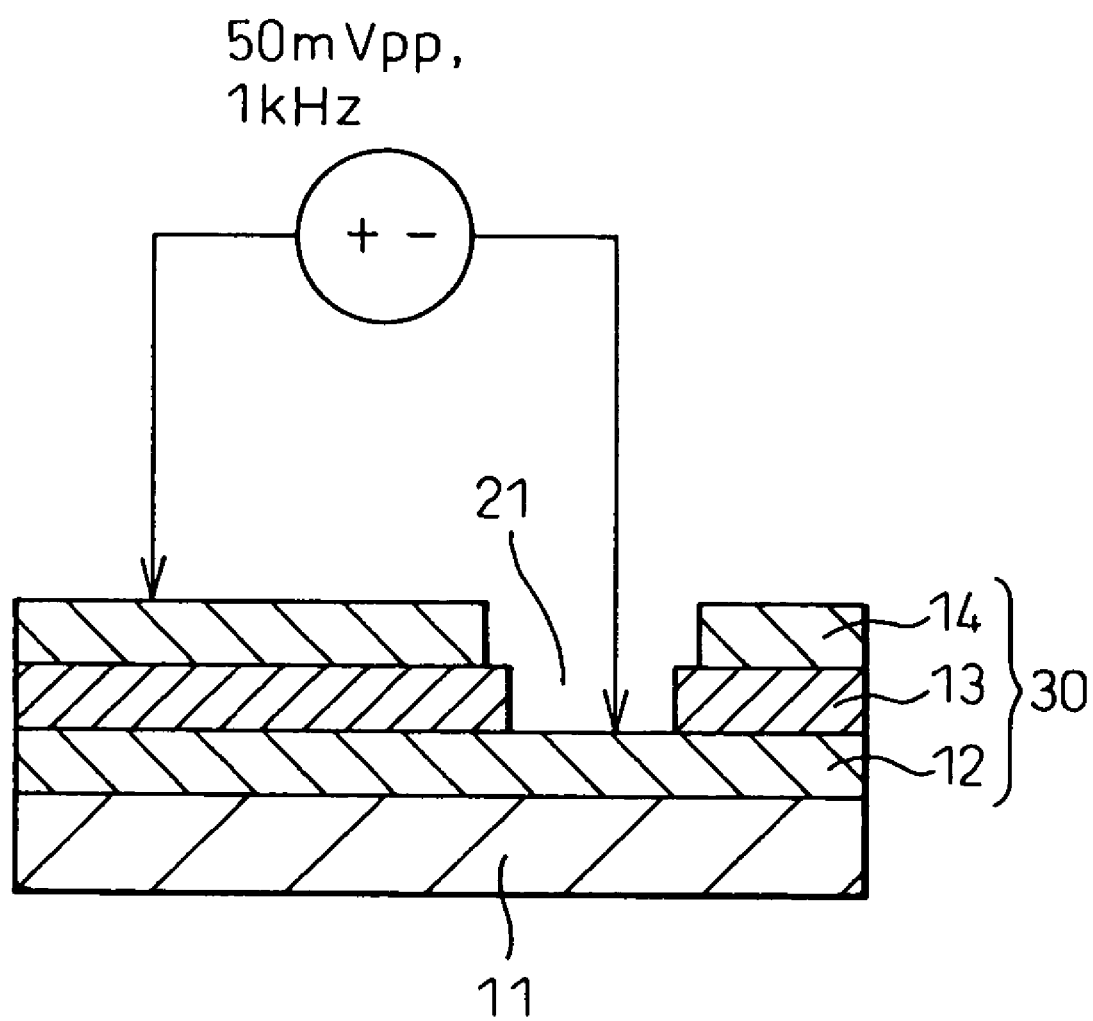
FIG. 7 is a schematic view showing the measurement circuit used in a capacitor characteristic measuring experiment for a thin layer capacitor element of the invention.
Figure 8:
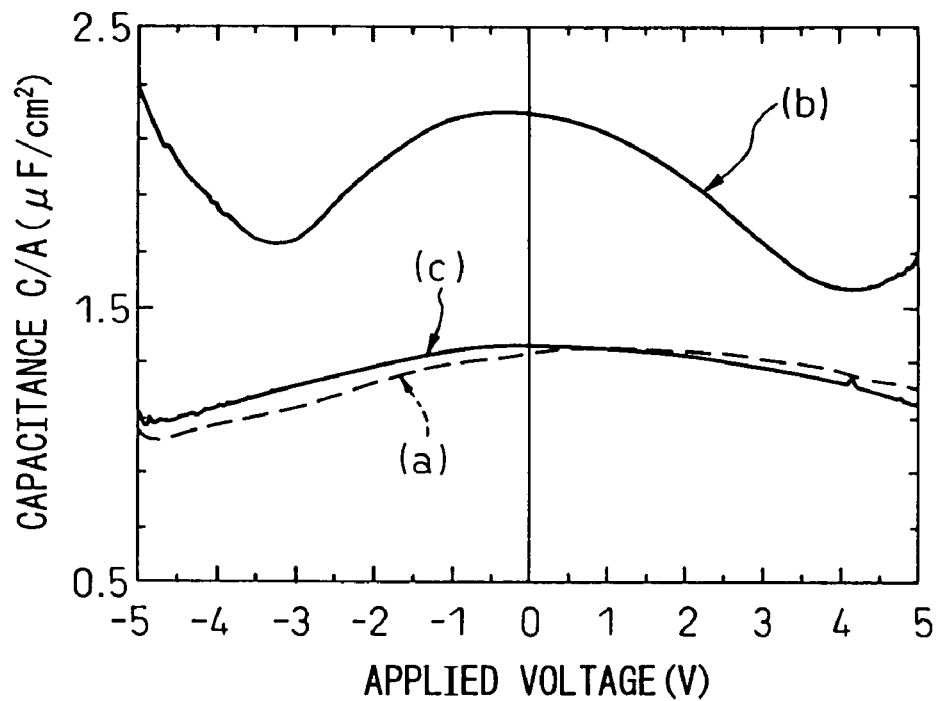
FIGS. 8 and 9 each is a graph showing the measurement results of a capacitor characteristic measuring experiment for a thin layer capacitor element of the invention.
Figure 9:
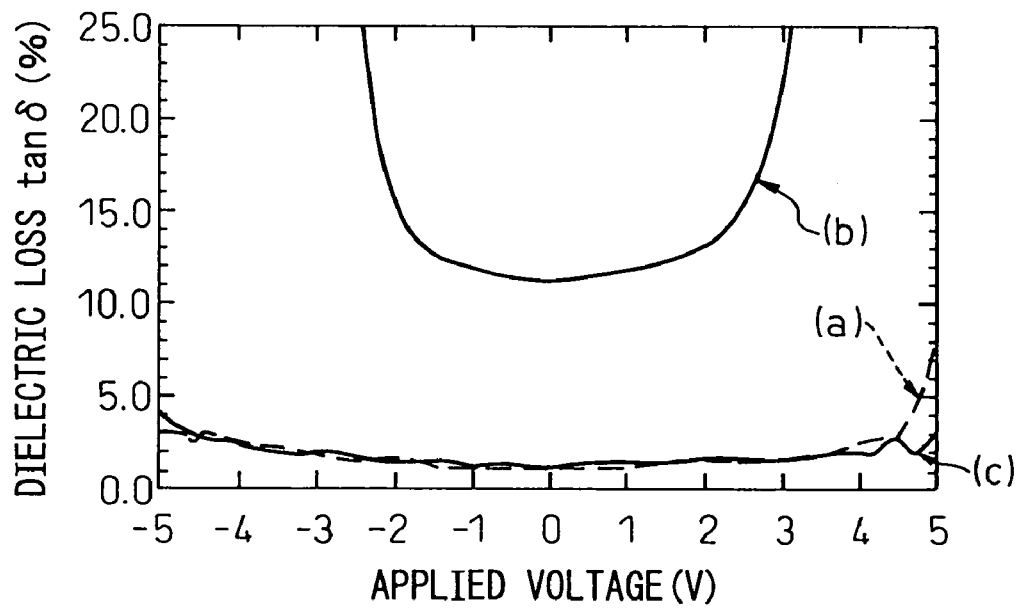

FIG. 7 is a schematic view of the measurement circuit used for the experiment, and FIGS. 8 and 9 are a pair of graphs showing the measurement results for the experiment.

In this experiment, silicon nitride ($Si_3N_4$) was used as the material for the barrier layer 15, platinum (Pt) was used as the material for the lower electrode layer 12 and upper electrode layer 14, and BST was used as the dielectric material.

First, a capacitor (capacitor structure) 30 was formed on a silicon substrate 11, a connecting forming hole 21 was formed for connection with the lower electrode layer 12 of the capacitor 30, and the resulting state was designated as the initial state. The capacitor characteristics were measured in the initial state (i.e., before forming the polyimide resin as the protective insulating layer 16), and then, after formation of the polyimide resin as the protective insulating layer 16, the capacitor characteristics were measured with and without formation of the barrier layer 15.

The circuit construction shown in FIG. 7 was used for the measurement, with an alternating current voltage of 50 $mV_{pp}$ applied to each electrode of the capacitor 30. A prescribed direct current voltage was simultaneously applied.

FIGS. 8 and 9 are graphs showing the results of this experiment. FIG. 8 shows the capacitance ($\mu F/cm^2$) characteristic with respect to applied voltage (V), and FIG. 9 shows the dielectric loss (%) characteristic with respect to applied voltage (V).

In each graph, the dotted curve (a) represents the initial characteristic before formation of the polyimide resin as the protective insulating layer 16.

The solid curve (b) represents the characteristic after formation of the polyimide resin as the protective insulating layer 16 for a thin layer capacitor with no barrier layer 15.

The solid curve (c) represents the characteristic after formation of the polyimide resin as the protective insulating layer 16 for a thin layer capacitor having a barrier layer 15.

As shown in FIG. 9, the thin layer capacitor element with no barrier layer 15 exhibited an increase in dielectric loss (tan δ) after formation of the polyimide resin as the protective insulating layer 16. Consequently, as indicated by the curve (b) in FIG. 8, the thin layer capacitor element with no barrier layer 15 exhibited a deterioration in capacitance after formation of the polyimide resin as the protective insulating layer 16.

In contrast, even after formation of the polyimide resin, the thin layer capacitor element with a barrier layer 15 exhibited no increase in dielectric loss or deterioration in capacitance compared to the initial state (i.e., before formation of the polyimide resin).

Thus, by covering the capacitor 30 with a barrier layer 15 to prevent infiltration of hydrogen into the upper electrode layer 14, it is possible to inhibit deterioration in the characteristics of the dielectric material.

(Second Embodiment)

A process for production of a thin layer capacitor element according to a second embodiment of the invention will now be explained.

The production process according to this embodiment can be carried out in accordance with the manner which is the same as that of the first embodiment described above with reference to FIGS. 6A to 6J. However, in this embodiment, formation of the dielectric layer 13 shown in FIG. 6C is carried out using a sputtering method in place of a sol-gel method, in contrast to the first embodiment. Also, a BST material in an amorphous state having the same composition as that of the dielectric layer 13 is used as the barrier layer 15 for the step of forming the barrier layer 15 shown in FIG. 6F.

First, a silicon wafer is used as the silicon substrate 11, and a sputtering method is used to form films of titanium oxide ($TiO_2$; 20 nm) and platinum (Pt; 100 nm) in that order on the silicon wafer, as shown in FIGS. 6A to 6D, in the same manner as the first embodiment. Iridium (Ir) may also be used as the lower electrode material.

Sputtering of the BST in the step of forming the dielectric layer 13 may be accomplished, specifically, under the following conditions.

The film is formed with a substrate temperature of 600° C., an $Ar/O_2$ ratio of 8/1, a gas pressure of 0.4 Pa and an RF power of 800 W, to obtain a dielectric BST layer with a film thickness of 100 nm, a dielectric constant of 400 and a dielectric loss of not more than 1%.

A film of platinum (Pt; 100 nm) is formed as an upper electrode layer 14 on the BST dielectric layer 13 by the same sputtering method as that described above (substrate temperature: 400° C.).

In the subsequent lower electrode connection-forming step shown in FIG. 6E, the platinum (Pt) film serving as the upper electrode layer 14 and the BST film serving as the dielectric layer 15 are dry etched in that order by argon Ar ion milling to form a connection to the lower electrode layer 12.

In the barrier layer-forming step shown in FIG. 6F, an amorphous BST thin film as a barrier layer 15 is formed at a thickness of 150 nm by sputtering. The conditions are a substrate temperature of 200° C., and $Ar/O_2$ ratio of 8/1, a gas pressure of 0.2 Pa and an RF power of 800 W. By forming the film at low temperature it is possible to avoid crystallization of the BST to obtain BST in an amorphous state.

Then, in the steps shown in FIGS. 6G to 6J, after forming the protective insulating layer 16 using a photosensitive polyimide resin in the same manner as in the second embodiment, the electrode pads 17 and bumps 18 are formed to complete the thin layer capacitor 20.

According to this embodiment, the barrier layer 15 and the dielectric layer 13 have the same composition and the material of the barrier layer 15 is in an amorphous state, such that the resulting thin layer capacitor 20 has high adhesion between the barrier layer 15 and dielectric layer 13, wherein the barrier layer 15 exhibits a high hydrogen ion blocking effect (i.e., a high reduction-resistant effect).

Moreover, by forming the dielectric layer 13 of the BST material by sputtering, formation of the capacitor 30 is carried out entirely in a vacuum, thereby allowing the thin layer capacitor element 20 to be fabricated by a simpler process.

(Third Embodiment)

Figure 10:
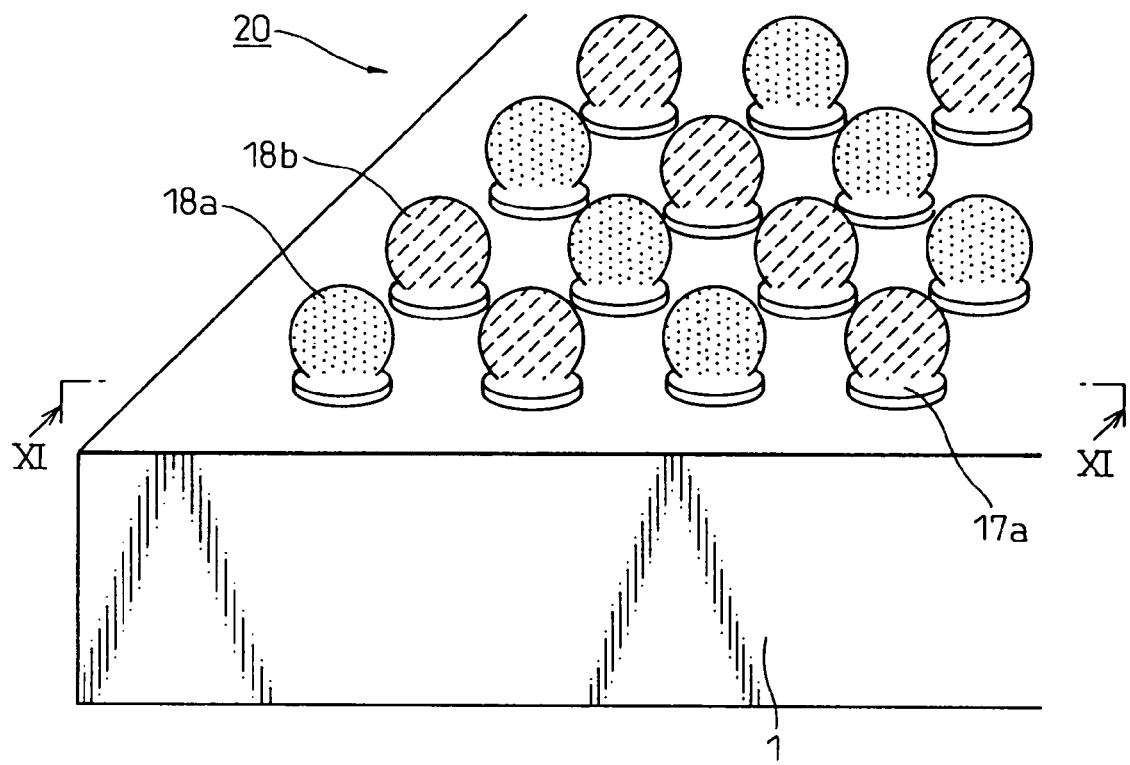
FIG. 10 is a perspective view of a thin layer capacitor element according to the third embodiment of the invention.
Figure 11:
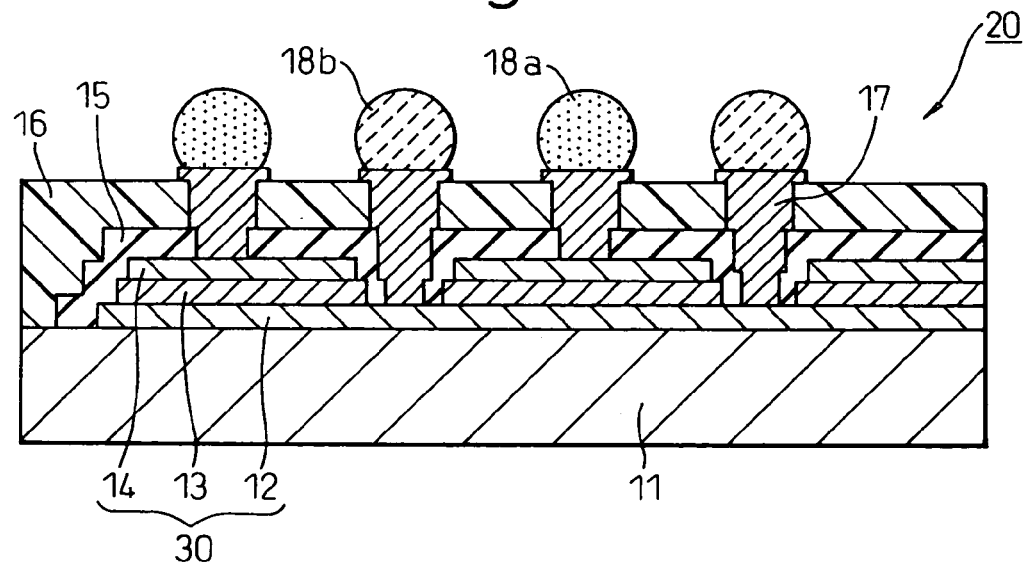
FIG. 11 is a cross-sectional view of the thin layer capacitor element taken along line XI—XI of FIG. 10.

A thin layer capacitor element according to a third embodiment of the invention will now be explained with reference to FIGS. 10 and 11, in which FIG. 10 is a perspective view of a thin layer capacitor element, and FIG. 11 is a cross-sectional view taken along line XI—XI of FIG. 10.

This embodiment is an application example of the thin layer capacitor element according to the first embodiment, and as shown in FIG. 10, a plurality of bumps are arrayed as terminals for the thin layer capacitor element 20 on one side of the thin layer capacitor element 20. The plurality of bumps 18 are arranged such that adjacent bumps are connected to different electrodes of the capacitor (capacitor structure) 30.

Specifically, each bump is electrically connected to every other electrode, and the connected capacitors 30 are internally connected together, as shown in FIG. 11.

For external connection of each bump, a bump 18a is connected to the power line of a circuit board (not shown), while a bump 18b is electrically connected to each GND line of the circuit board. The power and GND lines of the circuit board are in turn connected to an LSI or the like (not shown) mounted on the circuit board.

Thus, in this thin layer capacitor element 20, the terminals with the circuit board on which the thin layer capacitor element 20 is mounted are not limited to the edges of the package but are also provided at the center section of the package.

Consequently, even when the capacitor 30 inside the thin layer capacitor element 20 has a large form, the terminals may be provided at any desired location at the center of the package to reduce the spaces between power-GND terminals and achieve narrow wiring spaces over the entire area of power and GND wiring which connects the LSI and thin layer capacitor.

In other words, the thin layer capacitor element 20 has high capacitance and is capable of low inductance connection (the high-frequency characteristics are improved), and thus is suited for the optimum conditions for a decoupling capacitor.

According to this embodiment, therefore, it is possible to provide a thin layer capacitor element with high capacitance and excellent high-frequency characteristics.

(Fourth Embodiment)

Figure 12:
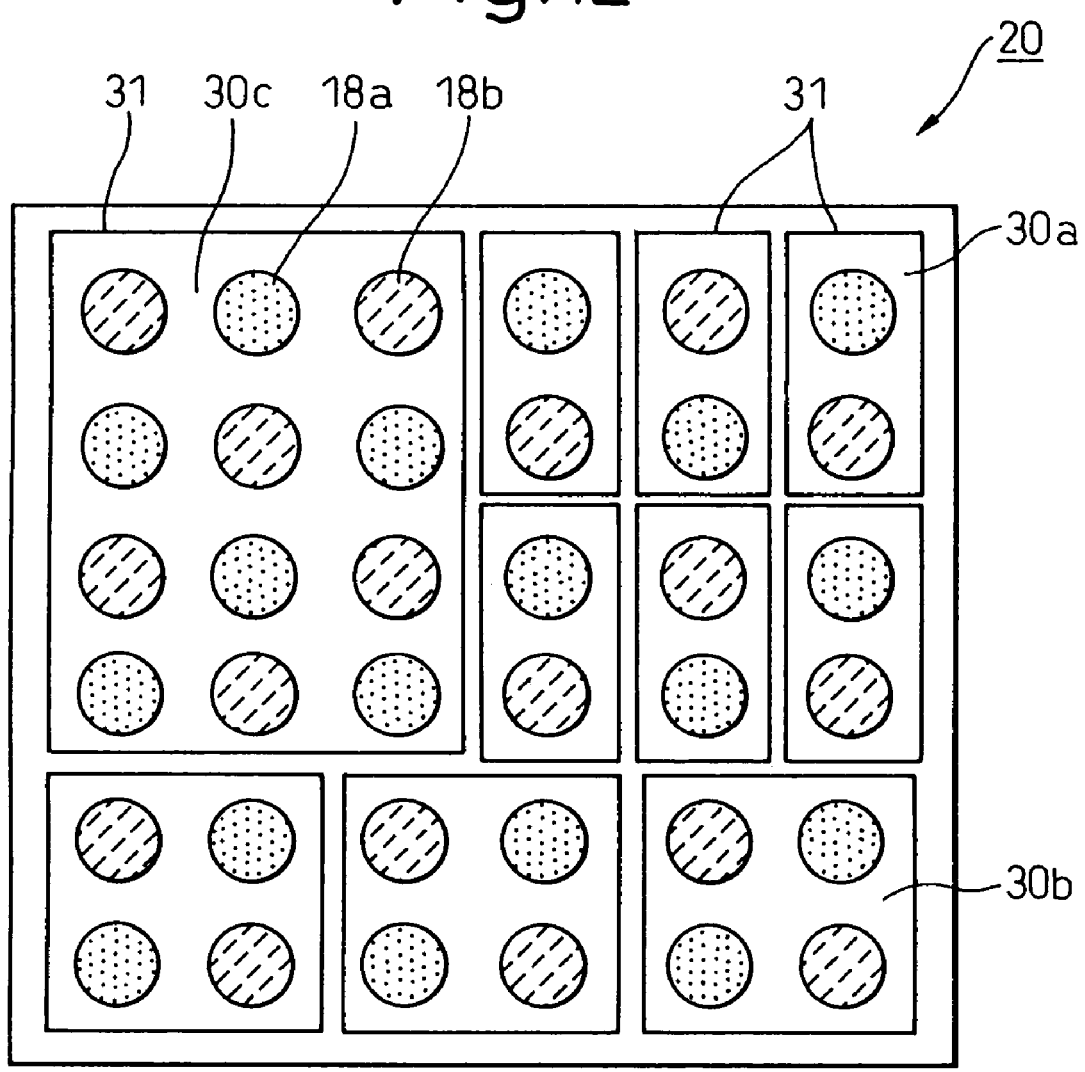
FIG. 12 is a top view showing a full constitutional of a thin layer capacitor element according to the fourth embodiment of the invention.

A thin layer capacitor according to a fourth embodiment of the invention will now be explained with reference to FIG. 12. FIG. 12 is a view from the top of the thin layer capacitor element 20, wherein reference numeral 31 indicates the capacitor area for the capacitors 30.

This embodiment is an application example of a thin layer capacitor element according to the third embodiment, and as shown in FIG. 12, a plurality of capacitors 30a, 30b and 30c with different sizes are arranged on one thin layer capacitor element 20.

The capacitance of each capacitor is generally in proportion to the surface area occupied by each capacitor. For example, capacitor 30b occupies twice the area of capacitor 30a, and has a capacitance of approximately twice that of capacitor 30a.

With this construction, for example, when a plurality of capacitors with different capacitances are necessary, it is sufficient to mount a single package instead of mounting a plurality of thin layer capacitor elements, thereby allowing more efficient use of the mounting area on the circuit board (not shown) on which the thin layer capacitor element 20 is mounted.

Additional effects that may be expected with this embodiment include reduced cost of parts for decoupling capacitors and fewer mounting steps for mounting of parts.

(Fifth Embodiment)

A thin layer capacitor element according to a fifth embodiment of the invention will now be explained with reference to FIG. 13 and FIGS. 14A to 14G.

(1) Capacitor-forming Step

Figure 14A:
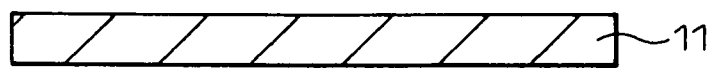
FIGS. 14A to 14G are cross-sectional views showing, in sequence, the steps of a production process for a thin layer capacitor element according to the fifth embodiment of the invention.
Figure 14B:
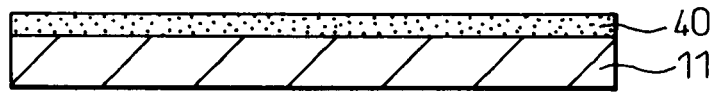

First, as shown in FIGS. 14A and 14B, a semiconductor substrate 11 made of $SiO_2$ or Si is set in a multi-target DC-RF magnetron sputtering apparatus for RF sputtering to form a 50 nm thick film of amorphous alumina at 200° C., as an adhesion layer 40.

Figure 14C:
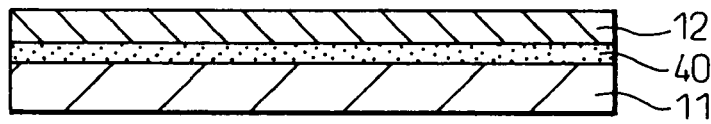

Next, as shown in FIG. 14C, a Au film is formed at 100 nm by DC sputtering at 200° C., as a lower electrode layer 12.

Figure 14D:
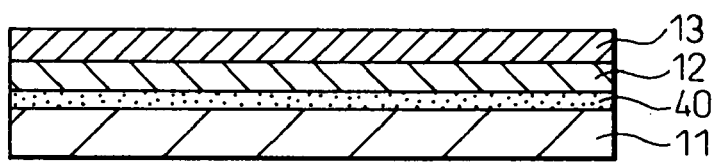
Figure 14E:
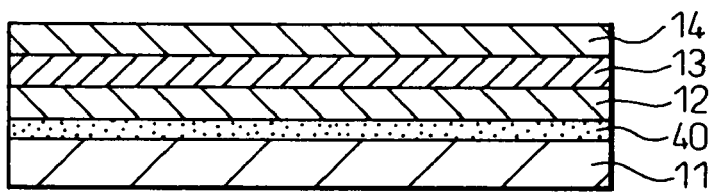

Then, as shown in FIG. 14D, a BST film is formed at 100 nm by RF sputtering at 400° C. as a dielectric layer 13, and as shown in FIG. 14E, a Au film is formed at 100 nm by DC sputtering at 400° C. as an upper electrode layer 14.

(2) Lower Electrode Connection-forming Step

Figure 14F:
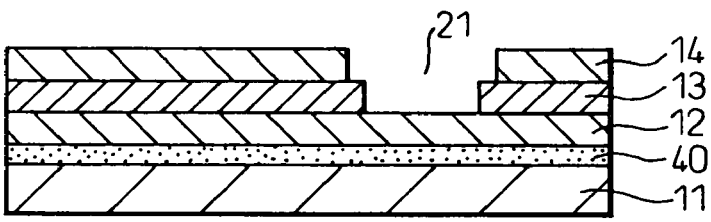

As shown in FIG. 14F, an electrode connection-forming hole 21 is formed in the lower electrode layer 12 by dry etching. Specifically, a resist mask is formed and then the upper electrode layer 14 and dielectric layer 13 are patterned in that order by argon Ar ion milling.

This is followed by post-annealing treatment in high-temperature oxygen at 350° C. The post-annealing treatment is treatment in which an object deficient in oxygen (in this case, the metal oxide BST film constituting the dielectric layer 13) is exposed to oxygen at high temperature to supply oxygen to the oxygen-deficient dielectric layer 13.

(3) Barrier Layer-forming Step

Figure 14G:
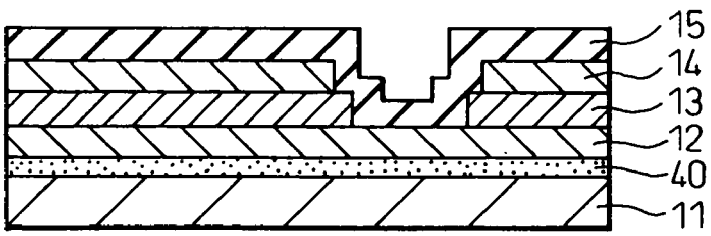

As shown in FIG. 14G, a barrier layer 15 is formed so as to cover the entirety of the capacitor 30 including the top and side thereof. Specifically, amorphous aluminum oxide ($Al_2O_3$; alumina) is formed at a thickness of 0.1 μm as the barrier layer 15, under room temperature conditions using the same apparatus as the sputtering apparatus used for formation of the adhesion layer 40 in step (1) above.

(4) Protective Insulating Layer-forming Step, and the Subsequent Steps

For this embodiment, formation of the protective insulating layer 16, electrode pads 17, etc. is carried out in the same manner as for the first embodiment.

Figure 13:
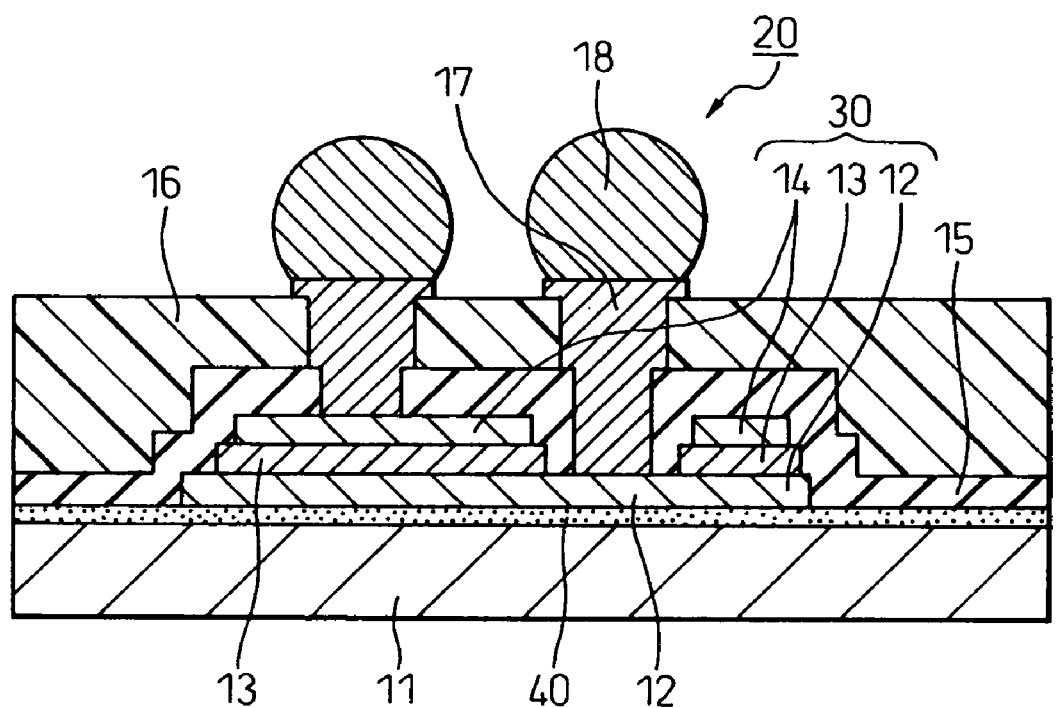
FIG. 13 is a cross-sectional view of a thin layer capacitor element according to the fifth embodiment of the invention.

Finally, a semiconductor substrate 11 having the necessary layers completely formed on the thin layer capacitor 20 is partitioned into a separate thin layer capacitor element 20 by dicing to form a thin layer capacitor element 20 as shown in FIG. 13.

A thin layer capacitor element 20 was actually formed by the production process described above according to this embodiment, and the characteristics thereof were measured. As a result, the capacitance was not less than 1 μF/cm², the ESR (equivalent series resistance) was not more than 0.01 Ω, the ESL (equivalent series inductance) was not more than 20 pH and the dielectric voltage was not less than 20V. For the insulation resistance, a high-temperature, high-humidity load test was conducted with operation for 500 hours under environmental conditions with a temperature of 85° C., a humidity of 85% RH and an applied voltage of 3 V, to obtain a value of not less than 10 MΩ.

The sputtering apparatus used for this embodiment will now be briefly described.

Figure 15:
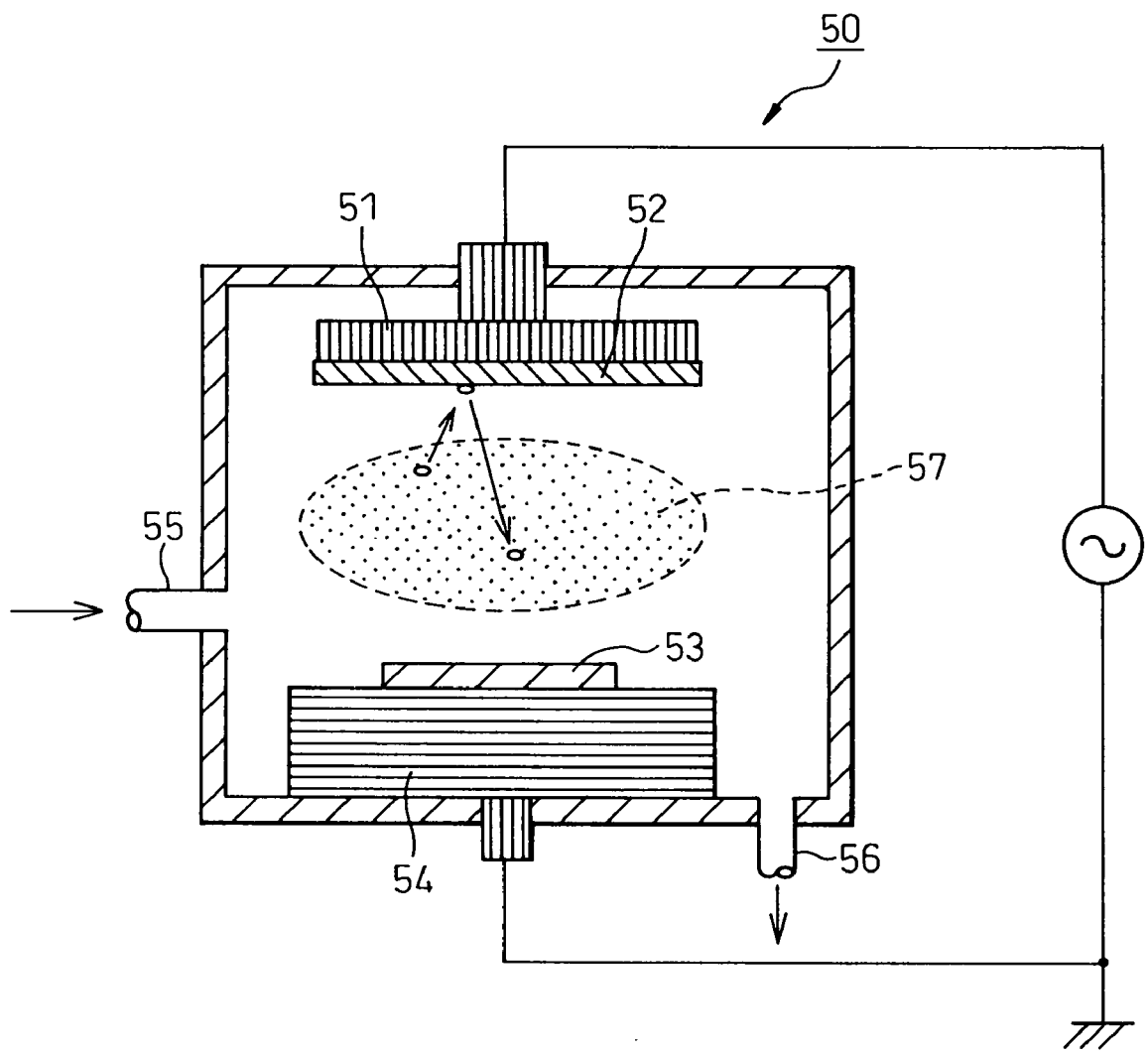
FIG. 15 is a schematic view showing a sputtering apparatus used in the embodiment of the invention.

In the sputtering apparatus 50, as shown in FIG. 15, a target electrode 51 and sample stage 54 are situated opposite each other above and below, with a wafer 53 as a sample being placed on the lower sample stage 54 and the target 52 being fitted under the upper target electrode 51 as shown in the drawing.

The interior of the sputtering apparatus 50 is placed under reduced pressure by a vacuum pump (not shown). An inert gas is introduced through an introduction port 55 and is discharged through a discharge port 56. A high voltage of about a few thousand volts is applied between the target electrode 51 and the sample stage 54, producing plasma-state cations 57 (for example, Ar$^+$) in the sputtering apparatus 50.

The cations impact the target 52 and the molecules of the target 52 dislodged by the impact adhere to the surface of the wafer 53 on the sample stage 54 and form a thin film on the wafer 53.

As the sputtering apparatus 50 is a sealed vacuum chamber and exchange of the target 52 is therefore difficult to accomplish, from the standpoint of productivity it is only possible to form a thin film with a composition of one type of material in a single sputtering apparatus 50.

In order to form a layer (thin film) having a composition of different materials, therefore, a number of sputtering apparatuses must be prepared which is equal to the number of materials to be used, thereby increasing equipment investment expense and making it impossible to reduce production costs.

This embodiment circumvents the problem by using the same material composition (aluminum oxide $Al_2O_3$) for the adhesion layer 40 and barrier layer 15, so that only three types of sputtering apparatuses are necessary for the adhesion layer, electrode layer and BST layer, respectively, and the cost required for the sputtering apparatuses can thus be minimized. The resulting effect is a lower production cost.

(Sixth Embodiment)

A thin layer capacitor element according to a sixth embodiment of the invention will now be explained.

This embodiment will be explained with reference to FIG. 13 and FIGS. 14A to 14G referred to for the fifth embodiment. Since this embodiment includes approximately the same steps as the fifth embodiment, only the differences with the fifth embodiment will be explained herein. Note that all of the conditions are the embodiment as for the fifth embodiment unless otherwise specified.

(1) Capacitor-forming Step

According to this embodiment, titanium oxide ($TiO_2$) is used to form a film as the adhesion layer 40 at 300° C. in FIGS. 14A and 14B. (According to the fifth embodiment, an amorphous alumina film was formed at 200° C. as the adhesion layer 40.)

Also according to this embodiment, a platinum (Pt) film is formed at 300° C. as the lower electrode layer 12 in FIGS. 14C to 14E. (According to the fifth embodiment, a Au film was formed at 200° C. as the lower electrode layer 12.)

Also according to this embodiment, a platinum (Pt) film is formed at 300° C. as the upper electrode 14. (According to the fifth embodiment, a Au film was formed at 400° C. as the upper electrode layer 14.)

(2) Lower Electrode Connection-forming Step

This step, shown in FIG. 14F, is the same as for the fifth embodiment.

(3) Barrier Layer-forming Step

According to this embodiment, an amorphous titanium oxide ($TiO_x$) film is formed as the barrier layer 15 in FIG. 14G. (According to the fifth embodiment, an amorphous aluminum oxide ($Al_2O_3$; alumina) film was formed as the barrier layer 15.) The sputtering apparatus used is the same sputtering apparatus used to form the adhesion layer 40 in step (1) above, as for the fifth embodiment.

(4) Protective Insulating Layer-forming Step and the Subsequent Steps.

For this embodiment, formation of the protective insulating layer 16, electrode pads 17, etc. is carried out in the same manner as for the first embodiment.

Finally, a semiconductor substrate 11 having the necessary layers completely formed on the thin layer capacitor element 20 is partitioned into a separate thin layer capacitor element 20 by dicing to form a thin layer capacitor element 20 as shown in FIG. 13.

A thin layer capacitor element 20 was actually formed by the production process described above, according to this embodiment, and the characteristics thereof were measured. As a result, the capacitance was not less than 1 μF/cm$^2$, the ESR was not more than 0.02 Ω, the ESL was not more than 20 pH and the dielectric voltage was not less than 20V. For the insulation resistance, a high-temperature, high-humidity load test was conducted with operation for 500 hours under environmental conditions with a temperature of 85° C., a humidity of 85% RH and an applied voltage of 3 V, to obtain a value of not less than 10 MΩ.

As this embodiment employs the same material composition (titanium oxide $TiO_x$) for the adhesion layer 40 and barrier layer 15, there is a merit that only three types of sputtering apparatuses are necessary for the adhesion layer, electrode layer and BST, respectively.

(Seventh Embodiment)

A thin layer capacitor element according to a seventh embodiment of the invention will now be explained.

This embodiment will be explained with reference to FIG. 13 and FIGS. 14A to 14G referred to for the fifth embodiment. Since this embodiment includes approximately the same steps as the fifth embodiment, as in the sixth embodiment, only the differences with the fifth embodiment will be explained. Note that all of the conditions are the same as for the fifth embodiment unless otherwise specified.

(1) Capacitor-forming Step

According to this embodiment, amorphous BST is used to form a film, as the adhesion layer 40, at room temperature in FIGS. 14A and 14B. (According to the fifth embodiment, an amorphous alumina film was formed at 200° C. as the adhesion layer 40.)

Also according to this embodiment, a platinum (Pt) film is formed at 300° C. as the lower electrode layer 12 in FIGS. 14C to 14E. (According to the fifth embodiment, a Au film was formed at 200° C. as the lower electrode layer 12.)

Also according to this embodiment, an amorphous BST film is formed as the dielectric layer 13. (According to the fifth embodiment, a BST film was formed as the dielectric layer 13.)

Also according to this embodiment, a platinum (Pt) film is formed at 300° C. as the upper electrode 14. (According to the fifth embodiment, a Au film was formed at 400° C. as the upper electrode layer 14.)

(2) Lower Electrode Connection-forming Step

This step shown in FIG. 14F is the same as for the fifth embodiment.

(3) Barrier Layer-forming Step

According to this embodiment, an amorphous BST film is formed as the barrier layer 15 in FIG. 14G. (According to the fifth mode, an amorphous aluminum oxide ($Al_2O_3$; alumina) film was formed as the barrier layer 15.) The sputtering apparatus used is the same sputtering apparatus used to form the adhesion layer 40 and dielectric layer 13 in step (1) above, as for the fifth embodiment.

(4) Protective Insulating Layer-forming Step and the Subsequent Steps

For this embodiment, formation of the protective insulating layer 16, electrode pads 17, etc. is carried out in the same manner as for the first embodiment.

Finally, a semiconductor substrate 11 having the necessary layers completely formed on the thin layer capacitor element 20 is partitioned into a separate thin layer capacitor element 20 by dicing to form a thin layer capacitor element 20 as shown in FIG. 13.

A thin layer capacitor element 20 was actually formed by the production process described above according to this embodiment, and the characteristics thereof were measured. As a result, the capacitance was not less than 1 µF/cm$^2$, the ESR was not more than 0.02 Ω, the ESL was not more than 20 pH and the dielectric voltage was not less than 20V. For the insulation resistance, a high-temperature, high-humidity load test was conducted with operation for 500 hours under environmental conditions with a temperature of 85° C., a humidity of 85% RH and an applied voltage of 3 V, to obtain a value of not less than 10 MΩ.

As this embodiment employs the same material composition (BST) for the adhesion layer 40, dielectric layer 13 and barrier layer 15, there is an advantage that only two types of sputtering apparatuses are necessary for the electrode layer and BST, respectively.

Finally, the preferred embodiments of the invention according to the first aspect thereof will be summarized as follows. Note, however, the embodiments are not restricted to those described in the following appendices.

(Appendix 1) A thin layer capacitor element comprising a capacitor with a dielectric layer made of a metal oxide and at least one protective insulating layer made of a resin material, characterized in that a barrier layer made of a non-conductive inorganic material is provided between the capacitor and the protective insulating layer.

(Appendix 2) A thin layer capacitor element characterized by comprising:

a capacitor with a dielectric layer made of a metal oxide, formed on a supporting substrate;

a barrier layer made of a non-conductive inorganic material covering at least the top and side of the capacitor; and at least one protective insulating layer made of a resin material, formed on the barrier layer.

(Appendix 3) A thin layer capacitor element as described in Appendix 1 or 2, characterized in that the barrier layer is a material having the same thermal expansion coefficient as that of the dielectric layer.

(Appendix 4) A thin layer capacitor element as described in Appendix 1 or 2, characterized in that the barrier layer has the same composition as that of the dielectric layer.

(Appendix 5) A thin layer capacitor element as described in Appendix 1 or 2, characterized in that the barrier layer is aluminum oxide, silicon oxide or silicon nitride.

(Appendix 6) A thin layer capacitor element as described in any one of Appendices 1 to 5, characterized in that the barrier layer is amorphous.

(Appendix 7) A thin layer capacitor element as described in any one of Appendices 1 to 6, characterized in that used as the material of the dielectric layer is a composite oxide comprising at least one of strontium, barium, lead, zinc, bismuth, tantalum, titanium, magnesium and niobium.

(Appendix 8) A thin layer capacitor element as described in any one of Appendices 1 to 7, characterized in that the sides of the capacitor have a stepwise fashion such that the edges of the lower layer extend outward beyond the edges of the upper layer.

(Appendix 9) A thin layer capacitor element as described in any one of Appendices 1 to 8, characterized in that the terminals for external electrical connection are provided at least at a location other than the edge of one side of the package.

(Appendix 10) A thin layer capacitor element as described in Appendix 9, characterized in that the electrode pads connecting the terminals and capacitor are supported by the protective insulating layer.

(Appendix 11) A thin layer capacitor element as described in any one of Appendices 1 to 10, characterized in that a plurality of capacitors with different capacitances are provided in a single thin layer capacitor.

(Appendix 12) A process for production of a thin layer capacitor element comprising a capacitor with a dielectric layer made of a metal oxide and at least one protective insulating layer made of a resin material, characterized by comprising the steps of:

forming the capacitor;

forming a barrier layer made of a non-conductive inorganic material, situated between the capacitor and the protective insulating layer; and forming the protective insulating layer situated on the barrier layer.

(Appendix 13) A process for production of a thin layer capacitor element characterized by comprising the steps of:

forming a capacitor with a dielectric layer made of a metal oxide, formed on a supporting substrate;

forming a barrier layer made of a non-conductive inorganic material covering at least the top and side of the capacitor; and forming at least one protective insulating layer made of a resin material, formed on the barrier layer.

(Appendix 14) A process for production of a thin layer capacitor element as described in Appendix 13, characterized in that the step of forming the dielectric layer is accomplished by a sputtering method.

(Appendix 15) A thin layer capacitor element as described in any one of Appendices 1 to 6, characterized in that the capacitor is formed on the supporting substrate via an adhesion layer having the same material composition as that of the barrier layer.

(Appendix 16) A thin layer capacitor element as described in Appendix 15, characterized in that the adhesion layer and barrier layer are made of a material composed mainly of alumina or $TiO_x$.

(Appendix 17) A thin layer capacitor element as described in Appendix 15, characterized in that the adhesion layer is made of a material composed mainly of polycrystalline $TiO_x$, and the barrier layer is made of a material composed mainly of amorphous $TiO_x$.

(Appendix 18) A thin layer capacitor element as described in Appendix 15, characterized in that the adhesion layer and barrier layer are made of a material composed mainly of amorphous perovskite oxide.

(Appendix 19) A thin layer capacitor element as described in Appendix 18, characterized in that the dielectric layer is made of a material composed mainly of crystalline perovskite oxide.

(Appendix 20) A thin layer capacitor element as described in Appendix 18, characterized in that the perovskite oxide contains, as a main component, $BaSrTiO_3$.

(Appendix 21) A process for production of a thin layer capacitor element as described in Appendix 12 or 13, characterized by further comprising a step of forming an adhesion layer made of a material composed mainly of alumina or BST on the supporting substrate, wherein the adhesion layer is formed in an amorphous state.

(Appendix 22) A process for production of a thin layer capacitor element as described in Appendix 12 or 13, characterized by further comprising a step of forming an adhesion layer composed mainly of $TiO_x$ on the supporting substrate at room temperature.

As explained in detail above with regard to the first aspect of the invention, the thin layer capacitor element of the invention comprises a capacitor with a dielectric layer made of a metal oxide and a protective insulating layer made of a resin material, in a construction wherein a barrier layer made of a non-conductive inorganic material is provided between the capacitor and the protective insulating layer.

As a result of this construction, a resin material such as polyimide which absorbs the mechanical stress from bumps may be used as the protective insulating layer, while reduction of the metal oxide dielectric layer material by moisture released from the resin material is prevented. It is thereby possible to provide a thin layer capacitor element which has excellent high-frequency tracking performance and low deterioration of characteristics.

Moreover, by using the same material composition for the barrier layer and the adhesion layer which increases the adhesion between the supporting substrate and the built-in capacitor, it is possible to reduce the number of types of sputtering apparatuses required for production to a minimum, and thereby lower equipment investment expense and vastly reduce production costs for thin layer capacitor elements.

Second Aspect of the Invention:

Preferred embodiments according to the second aspect of the invention will now be explained with reference to the attached drawings. Note that the features according to the first aspect of the invention may be introduced in this second aspect of the invention or alternatively the features according to this second aspect of the invention may be introduced in the above-described first aspect of the invention, if desired.

The capacitor element of the invention is a thin layer-type capacitor element, and preferably is used in the form of a product having two or more integrated capacitors (capacitor elements). The basic construction of the capacitor element of the invention comprises a substrate and a capacitor structure formed on the substrate, where the capacitor structure has a construction with a lower electrode (lower electrode layer), a dielectric layer formed on the lower electrode layer and an upper electrode (upper electrode layer) formed on the dielectric layer. The capacitor element of the invention is characterized in that the top side of its capacitor structure is covered with at least one protective insulating layer composed of an epoxy resin or the like.

Figure 16:
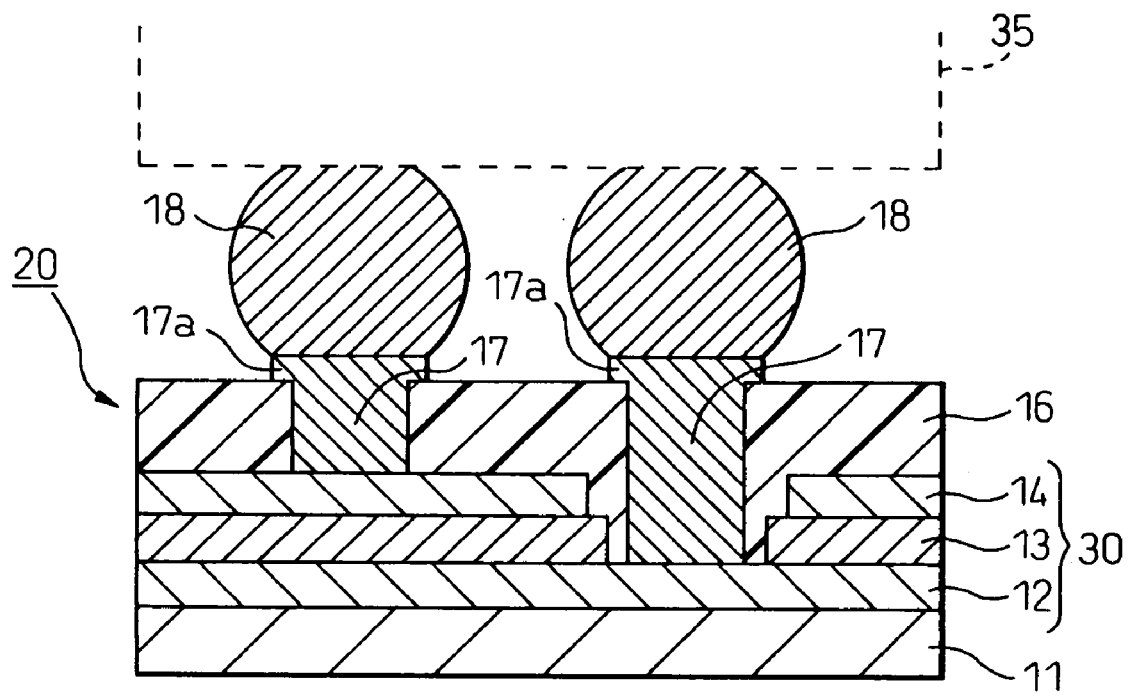
FIG. 16 is schematic cross-sectional view of a preferred embodiment of the thin layer capacitor element according to the invention.

An example of a simple construction of the thin layer capacitor element according to one preferred embodiment of the invention is shown in FIG. 16. Here, the capacitor element 20 has a substrate 11, for example, a silicon substrate, and the capacitor structure 30 is constructed on top of the substrate 11. The capacitor structure 30 has a lower electrode layer 12, such as a Pt electrode, a dielectric layer 13 such as a $(Ba,Sr)TiO_3$ electrode, and an upper electrode layer 14 such as a Pt electrode, in that order from the substrate side.

The top side of the capacitor structure 30 is protected by a protective insulating layer 16 formed from an insulating cured resin according to the invention, such as an epoxy resin, for example. The protective insulating layer 16 releases substantially no water during formation of the layer, i.e. in the curing and drying steps, or, if water is released, it is only at a level of at most 0.01 wt %. In this capacitor element 20, therefore, it is not necessary to provide a moistureproof or moisture resistant barrier layer between the protective insulating layer 16 and the capacitor structure 30, as is common practice in the prior art. In other words, the capacitor element of the invention has a preferred structure wherein the protective insulating layer may be directly covering the capacitor structure.

In addition, contact holes 17 are opened in the insulating protective layer 16 and each of the contact holes is filled with a conductive metal such as copper (Cu). The uppermost ends of the contact holes 17 have electrode pads 17a, respectively. Solder bumps 18 are formed on the electrode pads 17a for flip chip connection of a semiconductor element (for example, an LSI chip) 35. While not shown here, the capacitor element may also have one or more additional layers, at any desired location, as necessary.

One or more protective insulating layers are laminated in the manner of the invention on the capacitor structure of the thin layer capacitor element of the invention. The cured resin used to form the protective insulating layer may not be freely selected as is the case for the prior art thin layer capacitor elements, but instead:

(1) it must be formed from at least one resin precursor selected from the group consisting of thermosetting resins, photosetting resins and thermoplastic resins (a thermoplastic resin will usually be used in combination with a photosensitive agent), and (2) the amount of moisture released from the resin precursor during curing of the resin precursor must be a negligible degree which is substantially unmeasurable, or if released, the moisture must be a trace amount of no greater than 0.01 wt % of the resin precursor.

Considering that the thin film capacitor element of the invention is to be utilized for production of semiconductor devices with flip chip structures, the cured resin preferably exhibits a function of alleviating stress from solder bumps.

In the practice of the present invention, cured resins useful for the formation of a protective insulating layer include, but are not limited to, epoxy resins, bismaleimide/triazine (BT) resins, polytetrafluoroethylene (PTFE) resins, benzocyclobutene (BCB) resins, acrylic resins, diallyl phthalate resins and others. These resins may be used alone or in mixtures or combinations or two or more.

The protective insulating layer may be used in the form of a single layer, or in the form of a laminated structure of two or more layers. In either case, the thickness of the protective insulating layer may be varied within a wide range and is preferably in the range of about 0.01 to 1,000 μm and more preferably in the range of about 0.01 to 100 μm.

The capacitor structure has a dielectric layer as an essential constituent element. In the practice of the present invention, the dielectric layer used not particularly restricted, and may be formed from well-known dielectric materials, preferably, for example, an $ABO_3$ type composite metal oxide. A composite metal oxide used in this case has a dielectric constant preferably on the order of about 10 to 1,000. Suitable composite metal oxides for forming the dielectric layer are composite metal oxides comprising at least one metal selected from the group consisting of Sr, Ba, Pb, Zr, Bi, Ta, Ti, Mg and Nb.

The dielectric layer may be advantageously formed from a composite metal oxide represented by the following formula, for example:

$$Ba_xSr_{1-x}TiO_3$$

wherein 0<x<1.

The dielectric layer may also be advantageously formed from a composite metal oxide represented by the following formula.

$$(Ba_{(1-y)(1-x)}Sr_{(1-y)x}Y_y)Ti_{1+z}O_{3+\delta}$$

In this formula, 0<x<1, 0.007<y<0.02, −1<δ<0.5 and $(Ba_{(1-y)(1-x)}+Sr_{(1-y)x})/Ti_{1+z}<1$.

More preferably, the composite metal oxide represented by the above formula may be represented by the following formula:

$$(Ba_{0.689}Sr_{0.296}Y_{0.015})Ti_{1+z}O_{3+\delta}$$

wherein 0.02<z<0.05 and −0.3<δ<0.3, or the following formula:

$$(Ba_{0.493}Sr_{0.493}Y_{0.014})Ti_{1+z}O_{3+\delta}$$

wherein 0.02<z<0.05 and −0.3<δ<0.3.

The dielectric layer may also have different thicknesses depending on the construction of the capacitor element and electronic device, as well as other factors. The thickness of the dielectric layer is generally in the range of about 1 to 3,000 nm, preferably in the range of about 10 to 300 nm.

In the capacitor element of the invention, the substrate may be formed from any desired suitable material, but is preferably formed from an electrically insulating material. Suitable insulating materials include, but are not limited to, glass, semiconductor materials, resin materials, and the like. The thickness of the substrate may be varied within a wide range, but is preferably in the range of about 1 to 1,000 μm, more preferably in the range of about 100 to 500 μm.

A semiconductor material or wafer may be used with particular advantages as the insulating substrate in the practice of the invention. The semiconductor material or wafer may be formed from any of various materials, but preferably comprises at least one material selected from the group consisting of Si, Ge, SiGe, GaAs, InAs, InP and other compounds derived from elements of Groups III and V of the Periodic Table.

The capacitor element may further comprise an adhesion layer which may be called as a "joining tacky layer", between the substrate and the capacitor structure. The adhesion layer has the function of increasing the bonding strength between the substrate and the capacitor structure. The adhesion layer may be formed from any of various materials, but is preferably formed from at least one material selected from the group consisting of precious metals, precious metal alloys, alloys of precious metal and non-precious metal, conductive oxides of precious metals, insulating metal oxides, insulating metal nitrides, conductive metal nitrides and their combinations or mixtures. Suitable examples of adhesion layer-forming materials include, but are not limited to, Pt, Ir, Zr, Ti, $TiO_x$, $IrO_x$, $PtO_x$, $ZrO_x$, TiN, TiAlN, TaN, TaSiN and the like. The adhesive layer may be used in the form of a single layer or in the form of a multilayer structure comprising two or more layers. In either case, the thickness of the adhesion layer may be varied within a wide range and is preferably in the range of about 1 to 1,000 nm, more preferably in the range of about 1 to 100 nm.

In the capacitor element, the lower electrode layer may be formed from any of various conductive materials, but is preferably formed from at least one conductive material selected from the group consisting of transition metals, precious metals, precious metal alloys, alloys of precious metal and non-precious metal alloys, conductive oxides, and their combinations or mixtures. Suitable examples of lower electrode layer-forming materials include, but are not limited to, one or more materials selected from the group consisting of Pt, Pd, Ir, Ru, Rh, Re, Os, Au, Ag, Cu, Cr, $PtO_x$, $IrO_x$ and $RuO_x$ wherein x is a positive integer. The lower electrode layer may be used in the form of a single layer or in the form of a multilayer structure comprising two or more layers. In either case, the thickness of the lower electrode layer may be varied within a wide range and is preferably in the range of about 1 to 1,000 nm, more preferably in the range of about 1 to 100 nm.

Further, the upper electrode layer may be formed from any of various conductive materials, but is preferably formed from at least one conductive material selected from the group consisting of transition metals, precious metals, precious metal alloys, alloys of precious metal and non-precious metal alloys, conductive oxides, and their combinations or mixtures. Suitable examples of upper electrode layer-forming materials include, but are not limited to, one or more materials selected from the group consisting of Pt, Pd, Ir, Ru, Rh, Re, Os, Au, Ag, Cu, Cr, $PtO_x$, $IrO_x$, $RuO_x$, $SrRuO_3$ and $LaNiO_3$ wherein x is a positive integer. The upper electrode layer may be used in the form of a single layer or in the form of a multilayer structure comprising two or more layers. In either case, the thickness of the upper electrode layer may be varied within a wide range and is preferably in the range of about 1 to 1,000 nm, more preferably in the range of about 1 to 100 nm.

In addition to the layers described above, the capacitor element may also comprise a passivation film on the upper electrode layer, if permissible. Suitable examples of passivation films include, but are not limited to, silicon nitride films, silicon oxide ($SiO_2$) films, aluminum oxide (alumina) films and the like, with silicon nitride films being preferred. The thickness of the passivation film may be varied within a wide range but is preferably in the range of about 1 to 1,000 nm, more preferably in the range of about 1 to 100 nm.

In the capacitor element of the present invention, one or a combination of two or more capacitor structures may be constructed either on the surface side or back side section of the capacitor element or inside the capacitor element. The method and means for constructing the capacitor structure are not particularly restricted, and any conventional method or means may be used. For adaptation to increased processing speed and the like, it is advantageous to apply a combination of two or more capacitor structures to the capacitor element. In such cases, the plurality of capacitor structures may be connected in series or in parallel, depending on the device design and the desired effect. If necessary, a combination of series connections and parallel connections may of course be employed.

The present invention also provides, in addition to the thin layer capacitor element described above, a process for production of the thin layer capacitor element of the invention. As stated above in the paragraph "SUMMARY OF THE INVENTION", the invention resides in a process for production of a thin layer capacitor element comprising a substrate having formed thereon a capacitor, especially a capacitor structure having a construction with a dielectric layer sandwiched between a lower electrode layer and an upper electrode layer, and is characterized by forming the capacitor structure on the substrate and then applying at least one resin precursor, selected from the group consisting of thermosetting resins, photosetting resins and thermoplastic resins, on the upper electrode layer, and curing the resin precursor to form at least one protective insulating layer.

The process for production of a thin layer capacitor element of the invention may be advantageously carried out using well-known and commonly employed methods for production of capacitor elements and other devices, except for the step of forming the aforementioned specific protective insulating layer, without modification or with appropriate modifications as desired. Examples of suitable methods include photolithography, sputtering, vacuum deposition, etching and the like. Accordingly, the individual steps used to carry out the process of the invention will not be explained in detail here, but reference should be made to the articles or patent documents describing the thin layer capacitor elements.

The thin layer capacitor element shown schematically in FIG. 16 may be advantageously produced, for example, by the series of steps shown in order in FIGS. 17A to 17H.

Figure 17A:
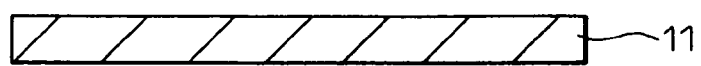
FIGS. 17A to 17H are cross-sectional views showing, in sequence, the steps in the process for producing the thin layer capacitor element shown in FIG. 16.

First, as shown in FIG. 17A, a silicon substrate 11 is prepared as the supporting substrate. Next, a lower electrode layer 12 composed of platinum shown in FIG. 17B, a dielectric layer 13 composed of a composite oxide shown in FIG. 17C and an upper electrode layer 14 composed of platinum (Pt) shown in FIG. 17D are formed in that order to form the capacitor structure indicated as reference numeral 30 in FIG. 16. A metal oxide with a high dielectric constant may be advantageously used as the material for the dielectric layer 13 to achieve a small size and large capacitance. Suitable metal oxides for carrying out the invention were mentioned above. Precious metals such as platinum (Pt) or iridium (Ir) may be advantageously used as materials for the electrodes (the lower electrode layer 12 and upper electrode layer 14 of the capacitor structure 30 since they have excellent oxidation resistance in high temperature environments and allow satisfactory crystal orientation control during formation of the dielectric layer 3.

Specifically, the series of fabrication steps may be carried out in the following manner.

Figure 17B:

For the step of forming the lower electrode layer 12 shown in FIG. 17B, first a silicon wafer is used as the silicon substrate 11, and a sputtering method is used to form layers of titanium oxide ($TiO_2$; 20 nm) and platinum (Pt; 100 nm) in that order on the silicon wafer 11. The titanium oxide ($TiO_2$; 20 nm) may also serve the role of an adhesion layer (joining layer) between the silicon (Si) and platinum (Pt).

The sputtering conditions for the titanium oxide ($TiO_2$) may be, for example, a substrate temperature of 500° C., an RF power of 200 W, a gas pressure of 0.1 Pa and an $Ar/O_2$ ratio of 7/1.

The sputtering conditions for the platinum (Pt) may be, for example, a substrate temperature of 400° C., a DC power of 100 W and a gas pressure of 0.1 Pa.

Figure 17C:
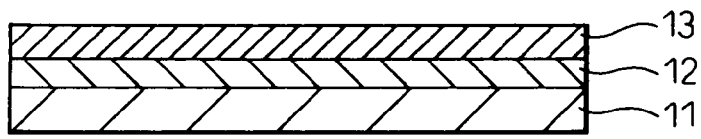
Figure 17D:
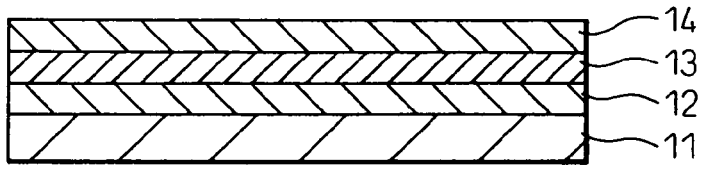

In the step of forming the dielectric layer 13 shown in FIG. 17C, a metal oxide composed of barium (Ba), strontium (Sr), yttrium (Y) and titanium (Ti) (($Ba_{(1-y)(1-x)}Sr_{(1-y)x}Y_y)Ti_{1+z}O_{3+\delta}$) is used as the dielectric material, and the dielectric layer 13 is formed by a sol-gel method. Alternatively, a sputtering method may be used.

Specifically, for the sol-gel method, an alkoxide starting solution is first used to form a layer by spin coating (for example, 2,000 rpm/30 seconds). An approximately 100 nm thick film is obtained through one spin coating step under these spin coating conditions. The resulting film is then prebaked for 10 minutes at a temperature of, for example, 400° C. and subjected to main baking for 10 minutes at a temperature of, for example, 700° C. to crystallize the metal oxide. A dielectric layer 13 with a thickness of 100 nm, a dielectric constant of 300 and a dielectric loss of no greater than 2% is thus obtained.

A sputtering method is used in the step of forming the upper electrode layer 14 shown in FIG. 17D, similar to formation of the lower electrode layer 12, to form a platinum (Pt) layer at a thickness of 100 nm as the upper electrode layer 14 on the dielectric layer 13.

Referring back to FIG. 16, the side of the capacitor structure 30 is formed in a stepwise fashion wherein the edge of the lower layer extends outward beyond the edge of the upper layer, as shown in the drawing. By providing such stepwise extending sections in the capacitor structure 30, it is possible to prevent the adverse effects of fragments (particles) at the extending sections, when fragments of the platinum material are produced during the production process, thereby preventing adhesion of the fragments onto the dielectric layer and avoiding short-circuits between the electrodes.

Figure 17E:
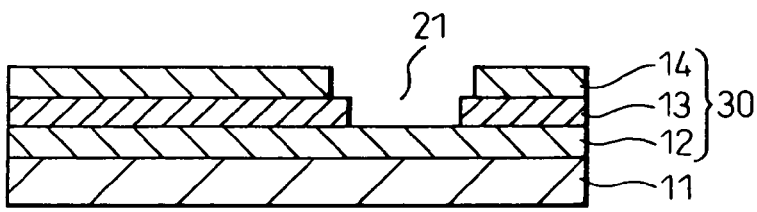

Next, as shown in FIG. 17E, an electrode connection-forming hole 21 for guiding an electrode from the lower electrode layer 12 is formed. Specifically, a resist mask is formed by photolithography, and then the Pt of the upper electrode layer 14 and the underlying dielectric layer 13 are dry etched in that order by argon Ar ion milling. Note that, in the prior art method, it was common to form the electrode connection-forming hole 21 in the above manner, followed by formation of a barrier layer by sputtering of silicon nitride ($Si_3N_4$) or the like so as to cover both the top and side of the capacitor structure 30 but, according to the present invention, such an increased number of processing steps is unnecessary.

Figure 17F:
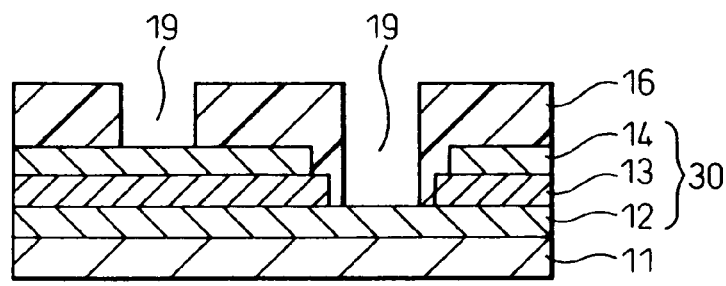

Subsequently, as shown in FIG. 17F, a protective insulating layer 16 made of an epoxy resin or the like is formed according to the invention on the capacitor structure 30 so as to cover it.

Specifically, in the formation of the protective insulating layer 16, a varnish of a photosensitive epoxy resin is spin coated, for example, at 3,000 rpm for 30 seconds, to form a 4 μm thick resin layer. This is followed by heating (prebaking) the resin layer, for 10 minutes at a temperature of 60° C. and then by exposure and development steps and heating (main baking) for 1 hour at a temperature of 200° C. A 2 μm thick protective insulating layer 16 composed of an epoxy resin film is thus obtained.

Next, the contact holes 19 are selectively formed at desired locations of the protective insulating layer 16, as shown in the drawing. Specifically, a resist mask (not shown) is formed by photolithography, and then dry etching is performed by argon Ar ion milling to selectively remove the undesired sections of the insulating protective layer 16 to thus expose the lower electrode layer 12.

The next step is formation of the electrode pads and bumps.

Figure 17G:
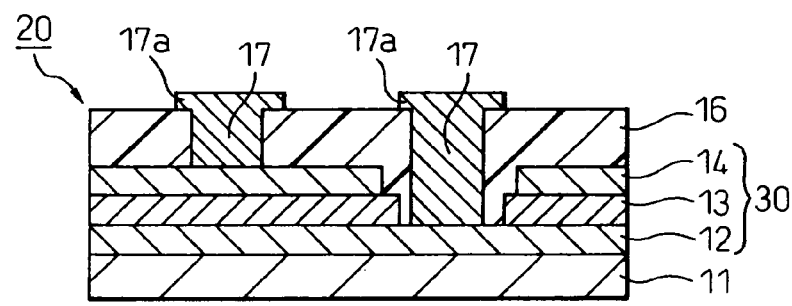

As shown in FIG. 17G, copper (Cu) is embedded in the contact holes 19, by plating, to form embedded Cu wiring layers 17. On the embedded Cu wiring layers 17, there are formed electrode pads 17a by sputtering and plating, as under bump metals (UBM) connecting each of the electrode layers of the capacitor structure 30 with the bumps.

Figure 17H:
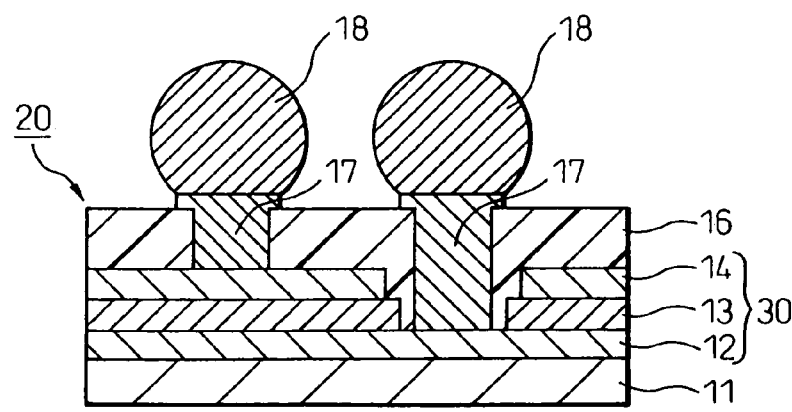

Finally, as shown in FIG. 17H, bumps 18 are formed on the previously formed electrode pads 17a as terminals for electrical connection with a circuit board. Solder is generally used as the material for the bumps 18, but solder materials can diffuse into the electrode pads and react with the platinum (Pt) of the electrode layers, thereby altering the resistance value of the platinum. For this reason, the material for the electrode pads is preferably chromium (Cr), titanium (Ti), copper (Cu), nickel (Ni) or the like from the standpoint of avoiding the aforementioned solder corrosion and improving the solder wettability.

The thin layer capacitor element 20 shown in FIG. 16 can be produced by the process described above. As the insulating protective layer 16 of this thin layer capacitor element 20 has no water or moisture absorbing property, it is possible to solve the problems encountered when using a polyimide resin as a protective insulating layer. The solved problems include the problem whereby moisture released from the polyimide resin reaches the catalytic Pt electrode while in a non-ionized state, resulting in reduction of the metal oxide of the dielectric layer 13 at the interface between the upper electrode layer 14 and the dielectric layer 13, and thereby impairing the characteristics of the element. Employing such a construction makes it possible to provide a thin layer capacitor element 20 with an excellent high frequency tracking performance and a low degradation of characteristics.

In addition, the present invention provides an electronic device in which a thin layer capacitor element according to the invention described above is mounted. The method and site of mounting the thin layer capacitor element are not particularly restricted, and for example, the capacitor element of the invention may be mounted on the upper part of and/or inside the device. In other words, an electronic device according to the invention is characterized by comprising at least one electronic element and at least one thin layer capacitor element of the invention.

There are no particular restrictions on the electronic element to be mounted in an electronic device of the invention. Examples of electronic elements that are suitable for carrying out the invention include, but are not limited to, the following: elements commonly employed in electronic devices, for example, capacitors, resistors, inductors, semiconductor elements such as LSI chips and VLSI chips, electrical wiring, electrodes and the like. Electronic devices according to the invention therefore include a wide scope of electronic devices such as semiconductor devices. Typical examples of electronic devices include, but are not limited to, microwave and RF devices, charge storage devices for decoupling capacitor, DRAM devices and the like.

As described above, a plurality of thin layer capacitor elements of the invention, connected either in series or in parallel, may be combined for mounting in the electronic device.

EXAMPLES

The present invention will be further described in the following examples. Note that the invention is in no way limited to these examples.

Example 1

In this example, a thin layer capacitor element was produced having the layer structure explained above with reference to FIG. 16. Specifically, the thin layer capacitor element of this example is provided with a capacitor structure comprising a lower electrode layer, dielectric layer and upper electrode layer, on a silicon substrate produced upon fabrication of a silicon wafer, and the top side of the capacitor structure is covered with a protective insulating layer according to the invention.

After thermal oxidation of the silicon substrate to form a silicon oxide film ($SiO_2$) on the surface, RF magnetron sputtering was carried out to form a $TiO_2$ adhesion layer with a thickness of 20 nm on the $SiO_2$ film. The sputtering conditions for the $TiO_2$ layer were a substrate temperature of 500° C., an RF power of 200 W, a gas pressure of 0.1 Pa and an $Ar/O_2$ ratio of 7/2.

Next, a platinum (Pt) film was formed by DC magnetron sputtering to form the lower electrode layer. A lower electrode layer with a thickness of 100 nm was obtained. The sputtering conditions for the Pt layer were a substrate temperature of 400° C., a DC power of 100 W and an Ar gas pressure of 0.1 Pa.

After forming the lower electrode layer, barium strontium titanate ($Ba_{0.7}Sr_{0.3}$)$TiO_3$ (BST) was used as the starting material to form a dielectric layer by a sol-gel method. The BST used for this example was a material with a relatively large dielectric constant (about 1,500, measured as a bulk), effective for realizing a miniature large capacitance capacitor element. Specifically, the layer was formed by spin coating an alkoxide starting solution (2,000 rpm, 30 seconds). One spin coat produced an approximately 100 nm thick layer. This was followed by prebaking (400° C./10 min) and main baking (700° C./10 min) for crystallization of the BST. The resulting dielectric layer was composed of BST and had a thickness of 100 nm, a dielectric constant of 300 and a dielectric loss of no greater than 2%.

Next, a platinum (Pt) film was formed by DC magnetron sputtering following the same procedure as for formation of the lower electrode layer, to form an upper electrode layer with a thickness of 100 nm.

This was followed by etching of the upper electrode layer, dielectric layer (BST film) and lower electrode layer in that order to selectively produce contact holes.

For formation of the contact holes, a photoresist (trade name: AZP4620, product of Clariant Japan) was applied over the upper electrode layer and cured, and then the cured resist film was patterned to form a resist mask. In the presence of the resist mask, the upper electrode layer and dielectric layer were dry etched in that order by Ar ion milling. The desired contact holes were formed, thereby exposing the lower electrode layer.

An epoxy resin was then used to form a protective insulating layer. A varnish of photosensitive epoxy resin (trade name: "WPR-S101", product of JSR) was applied by spin coating (3,000 rpm/30 sec) to form a 4 Am thick film. It was then prebaked (60° C./10 min), subjected to exposure and development steps, and then main baked (200° C./1 hour). An epoxy resin-based protective insulating layer with a thickness of 2 μm was thus obtained.

After forming the protective insulating layer in this manner, copper (Cu) was filled into the contact holes, by plating, to form an embedded Cu wiring layer, and then electrode pads were formed by Cu plating as an under bump metal (UBM) over the embedded Cu wiring layer.

Finally, solder bumps were formed on the formed electrode pads as terminals for electrical connection with a circuit board. The thin layer capacitor element shown in FIG. 16 was thus completed.

Figure 4:
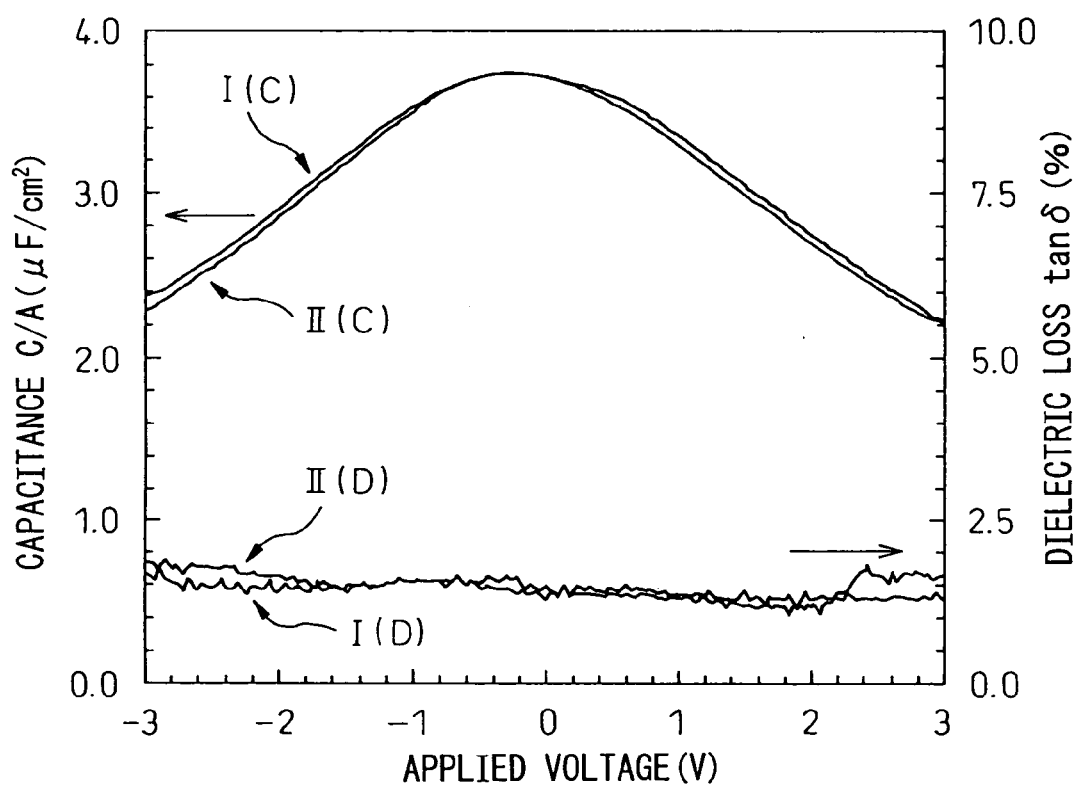
FIG. 4 is a graph showing combined plots of the C-V (electrostatic capacitance—applied voltage) characteristic and D-V (dielectric loss—applied voltage) characteristic obtained using a specific cured resin as the protective layer in a thin layer capacitor element according to the invention.

In the produced thin layer capacitor element, the voltage tracking characteristics of the electrostatic capacitance and dielectric loss were measured to obtain the graph plotted in FIG. 4. In FIG. 4, curves I(C) and II(C) respectively represent the C-V characteristic before and after formation of the epoxy resin-based protective layer, while curves I(D) and II(D) respectively represent the D-V characteristic before and after formation of the epoxy resin-based protective layer. As can be clearly seen from the graph in FIG. 4, formation of the protective insulating layer on the thin layer capacitor element according to the invention inhibited the adverse effect of moisture on the dielectric layer, making it possible to achieve stable electrostatic capacitance and dielectric loss while preventing deterioration of the element characteristics.

Example 2

The procedure described in Example 1 was repeated but, for this example, benzocyclobutene (BCB) resin was used as the protective insulating layer in place of an epoxy resin.

RF magnetron sputtering was carried out to form a $TiO_2$ adhesive layer with a thickness of 20 nm on the $SiO_2$ film formed on the silicon substrate.

Next, a platinum (Pt) film was formed by DC magnetron sputtering to form the lower electrode layer having a thickness of 100 nm. Further, in this example, for the reference, the lower electrode layer and an upper electrode layer described below were also formed from iridium (Ir) in place of Pt. The characteristics of the resulting thin layer capacitor element using Ir were satisfactory comparable to those obtained using Pt.

After forming the lower electrode layer, barium strontium titanate $(Ba_{0.7}Sr_{0.3})TiO_3$ (BST) was used as the starting material to form a dielectric layer by RF magnetron sputtering. The BST film sputtering conditions were a substrate temperature of 600° C., an RF power of 800 W, a gas pressure of 0.4 Pa and an $Ar/O_2$ ratio of 8/1. This produced a dielectric layer composed of a thin BST film with a thickness of 100 nm, a dielectric constant of 400 and a dielectric loss of no greater than 1%.

Thereafter, a platinum (Pt) or iridium (Ir) film was formed by DC magnetron sputtering following the same procedure as for formation of the lower electrode layer, to form an upper electrode layer with a thickness of 100 nm.

This was followed by etching of the upper electrode layer, dielectric layer (BST film) and lower electrode layer in that order to selectively form contact holes.

For formation of the contact holes, a photoresist (trade name: AZP4620, product of Clariant Japan) was applied over the upper electrode layer and cured, and then the cured resist film was patterned to form a resist mask. In the presence of the resist mask, the upper electrode layer and dielectric layer were dry etched in that order by Ar ion milling. The desired contact holes were formed, thereby exposing the lower electrode layer.

A BCB resin was then used to form a protective insulating layer. A BCB resin varnish (trade name: "CYCLOTENE4024", product of Dow Chemical Japan) was applied by spin coating (2,000 rpm/30 sec) to form a 4.5 µm thick film. The film was then prebaked (70° C./20 min), subjected to exposure and development steps, and then main baked (250° C./1 hour). This produced a BCB resin-based protective insulating layer with a thickness of 3 µm.

After forming the protective insulating layer as described above, copper (Cu) was filled into the contact holes by plating to form an embedded Cu wiring layer, and then electrode pads were formed by Cu plating as an under bump metal (UBM) over the embedded Cu wiring layer. Finally, solder bumps were formed on the formed electrode pads as terminals for electrical connection with a circuit board.

In the produced thin layer capacitor element, the voltage tracking characteristics of the electrostatic capacitance and dielectric loss were measured to confirm that both characteristics were stably maintained and the element characteristics suffered no deterioration, similar to those of Example 1 above.

Hereinabove, the invention was described in detail with regard to its embodiments and examples. Finally, the preferred embodiments of the invention will be summarized as follows. Note, however, the embodiments are not restricted to those described in the following appendices.

(Appendix 1) A thin layer capacitor element comprising a substrate having formed thereon a capacitor structure constituted from a dielectric layer sandwiched between a lower electrode layer and an upper electrode layer, characterized in that the top of the capacitor structure is covered with at least one protective insulating layer composed of a cured resin, and the cured resin is formed from at least one resin precursor selected from the group consisting of thermosetting resins, photosetting resins and thermoplastic resins.

(Appendix 2) A thin layer capacitor element as described in Appendix 1, characterized in that the amount of moisture discharged from the resin precursor upon curing of the resin precursor is not more than 0.01 wt % of the resin precursor.

(Appendix 3) A thin layer capacitor element as described in Appendix 1 or 2, characterized in that the cured resin is at least one resin selected from the group consisting of epoxy resins, bismaleimide/triazine (BT) resins, polytetrafluoroethylene (PTFE) resins, benzocyclobutene (BCB) resins, acrylic resins and diallyl phthalate resins.

(Appendix 4) A thin layer capacitor element as described in any one of Appendices 1 to 3, characterized in that the protective insulating layer has a multilayer structure.

(Appendix 5) A thin layer capacitor element as described in any one of Appendices 1 to 4, characterized in that the protective insulating layer directly covers the capacitor structure.

(Appendix 6) A thin layer capacitor element as described in any one of Appendices 1 to 5, characterized in that the dielectric layer of the capacitor structure comprises a composite metal oxide comprising at least one metal selected from the group consisting of Sr, Ba, Pb, Zr, Bi, Ta, Ti, Mg and Nb.

(Appendix 7) A thin layer capacitor element as described in any one of Appendices 1 to 5, characterized in that the dielectric layer of the capacitor structure comprises a composite metal oxide represented by the following formula:

$$Ba_xSr_{1-x}TiO_3$$

where x is a positive integer.

(Appendix 8) A thin layer capacitor element as described in any one of Appendices 1 to 5, characterized in that the dielectric layer of the capacitor structure comprises a composite metal oxide represented by the following formula:

$$(Ba_{(1-y)(1-x)}Sr_{(1-y)x}Y_y)Ti_{1+z}O_{3+\delta}$$

where $0<x<1$, $0.007<y<0.02$, $-1<\delta<0.5$ and $(Ba_{(1-y)(1-x)}+Sr_{(1-y)x})/Ti_{1+z}<1$.

(Appendix 9) A thin layer capacitor element as described in Appendix 8, characterized in that the composite metal oxide is represented by the following formula:

$$(Ba_{0.689}Sr_{0.296}Y_{0.015})Ti_{1+z}O_{3+\delta}$$

where $0.02<z<0.05$ and $-0.3<\delta<0.3$.

(Appendix 10) A thin layer capacitor element as described in Appendix 8, characterized in that the composite metal oxide is represented by the following formula:

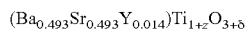

$(Ba_{0.493}Sr_{0.493}Y_{0.014})Ti_{1+z}O_{3+\delta}$ where $0.02 < z < 0.05$ and $-0.3 < \delta < 0.3$.

(Appendix 11) A thin layer capacitor element as described in any one of Appendices 1 to 10, characterized in that the dielectric layer has a thickness of about 1 to 3,000 nm.

(Appendix 12) A thin layer capacitor element as described in any one of Appendices 1 to 11, characterized in that the substrate comprises an electrically insulating material selected from the group consisting of glass, semiconductor materials and resin materials.

(Appendix 13) A thin layer capacitor element as described in any one of Appendices 1 to 12, characterized in that the substrate comprises a semiconductor material or wafer.

(Appendix 14) A thin layer capacitor element as described in Appendix 13, characterized in that the semiconductor material or wafer comprises Si, Ge, SiGe, GaAs, InAs, InP or other compounds derived from elements of Groups III and V of the Periodic Table.

(Appendix 15) A thin layer capacitor element as described in any one of Appendices 1 to 14, characterized by further comprising an adhesion layer between the substrate and the capacitor structure.

(Appendix 16) A thin layer capacitor element as described in Appendix 15, characterized in that the adhesion layer comprises at least one material selected from the group consisting of precious metals, precious metal alloys, alloys of precious metal and non-precious metal, conductive oxides of precious metals, insulating metal oxides, insulating metal nitrides, conductive metal nitrides and their combinations or mixtures.

(Appendix 17) A thin layer capacitor element as described in Appendix 15 or 16, characterized in that the adhesion layer comprises at least one material selected from the group consisting of Pt, Ir, Zr, Ti, $TiO_x$, $IrO_x$, $PtO_x$, $ZrO_x$, TiN, TiAlN, TaN and TaSiN.

(Appendix 18) A thin layer capacitor element as described in any one of Appendices 15 to 17, characterized in that the adhesion layer has a multilayer structure.

(Appendix 19) A thin layer capacitor element as described in any one of Appendices 1 to 18, characterized in that the lower electrode layer comprises at least one material selected from the group consisting of transition metals, precious metals, precious metal alloys, alloys of precious metal and non-precious metal, conductive oxides, and their combinations or mixtures.

(Appendix 20) A thin layer capacitor element as described in any one of Appendices 1 to 19, characterized in that the lower electrode layer comprises at least one material selected from the group consisting of Pt, Pd, Ir, Ru, Rh, Re, Os, Au, Ag, Cu, Cr, $PtO_x$, $IrO_x$ and $RuO_x$ wherein x is a positive integer.

(Appendix 21) A thin layer capacitor element as described in any one of Appendices 1 to 20, characterized in that the lower electrode layer has a multilayer structure.

(Appendix 22) A thin layer capacitor element as described in any one of Appendices 1 to 21, characterized in that the upper electrode layer comprises at least one material selected from the group consisting of transition metals, precious metals, precious metal alloys, alloys of precious metal and non-precious metal, conductive oxides, and their combinations or mixtures.

(Appendix 23) A thin layer capacitor element as described in any one of Appendices 1 to 22, characterized in that the upper electrode layer comprises at least one material selected from the group consisting of Pt, Pd, Ir, Ru, Rh, Re, Os, Au, Ag, Cu, Cr, $PtO_x$, $IrO_x$, $RuO_x$, $SrRuO_3$ and $LaNiO_3$ wherein x is a positive integer.

(Appendix 24) A thin layer capacitor element as described in any one of Appendices 1 to 23, characterized in that the upper electrode layer has a multilayer structure.

(Appendix 25) A thin layer capacitor element as described in any one of Appendices 1 to 24, characterized by further comprising a passivation film on the upper electrode layer.

(Appendix 26) A thin layer capacitor element as described in Appendix 25, characterized in that the passivation film comprises a silicon nitride layer.

(Appendix 27) A process for production of a thin layer capacitor element comprising a substrate having formed thereon a capacitor structure constituted from a dielectric layer sandwiched between a lower electrode layer and an upper electrode layer, characterized by forming the capacitor structure on a substrate and then applying at least one resin precursor selected from the group consisting of thermosetting resins, photosetting resins and thermoplastic resins on the upper electrode layer and curing the resin precursor to form at least one protective insulating layer.

(Appendix 28) A process for production of a thin layer capacitor element as described in Appendix 27, characterized in that during curing of the resin precursor, the amount of moisture discharged from the resin precursor upon curing is limited to not more than 0.01 wt % of the resin precursor.

(Appendix 29) A process for production of a thin layer capacitor element as described in Appendix 27 or 28, characterized in that the protective insulating layer is formed from at least one cured resin selected from the group consisting of epoxy resins, bismaleimide/triazine (BT) resins, polytetrafluoroethylene (PTFE) resins, benzocyclobutene (BCB) resins, acrylic resins and diallyl phthalate resins.

(Appendix 30) A process for production of a thin layer capacitor element as described in any one of Appendices 27 to 29, characterized in that the protective insulating layer is formed directly on the capacitor structure.

(Appendix 31) A process for production of a thin layer capacitor element as described in any one of Appendices 27 to 30, characterized by further comprising a step of forming an adhesion layer between the substrate and the lower electrode layer of the capacitor structure.

(Appendix 32) An electronic device characterized by comprising at least one electronic element and at least one thin layer capacitor element as described in any one of Appendices 1 to 26.

(Appendix 33) An electronic device as described in Appendix 32, characterized in that the electronic element is selected from the group consisting of conventional type capacitors, resistors, inductors, semiconductor elements, wiring layers and electrode layers.

As explained in detail above with regard to the second aspect of the invention, since a specific protective insulating layer covers the capacitor structure of the thin layer capacitor element according to the invention, infiltration of hydrogen into the electrode layer can be blocked and thus it is possible to eliminate damage to the layer, such as oxygen loss of the oxide dielectric thin layer due to conversion of water-to-oxygen which has occurred during resin curing in the prior art processes, and to thereby enhance the reliability and extend the characteristic lifespan of thin layer capacitor elements and, hence, the electronic devices.

The invention claimed is:

1. A thin layer capacitor element comprising a capacitor with a dielectric layer made of a metal oxide and at least one protective insulating layer made of a cured resin, in which a barrier layer comprising a non-conductive inorganic material is provided between the capacitor and the protective insulating layer, and the barrier layer is a material having the same thermal expansion coefficient as that of the dielectric layer.

2. A thin layer capacitor element comprising a substrate having formed thereon a capacitor with a dielectric layer made of a metal oxide, in which
   a barrier layer comprising a non-conductive inorganic material is covering at least the top and side of the capacitor, and
   at least one protective insulating layer made of a cured resin is formed on the barrier layer, and the barrier layer is a material having the same thermal expansion coefficient as that of the dielectric layer.

3. A thin layer capacitor element as described in claim 1 or 2, in which the barrier layer has the same composition as that of the dielectric layer.

4. A thin layer capacitor element as described in claim 1 or 2, in which the barrier layer is aluminum oxide, silicon oxide or silicon nitride.

5. A thin layer capacitor element as described in claim 1 or 2, in which the barrier layer is amorphous.

6. A thin layer capacitor element as described in claim 1 or 2, in which the dielectric layer comprises a composite metal oxide comprising at least one metal selected from strontium (Sr), barium (Ba), lead (Pb), zinc (Zr), bismuth (Bi), tantalum (Ta), titanium (Ti), magnesium (Mg) and niobium (Nb).

7. A thin layer capacitor element as described in claim 1 or 2, which further comprises the terminals for external electrical connection provided at least at a location other than the edge of one side of the package.

8. A thin layer capacitor as described in claim 1 or 2, in which a plurality of capacitors with different capacitances are provided in one thin layer capacitor element.

9. A thin layer capacitor as described in claim 2, in which the capacitor is formed on the substrate via an adhesion layer having the same material composition as that of the barrier layer.

10. A process for production of a thin layer capacitor element comprising a capacitor with a dielectric layer made of a metal oxide and at least one protective insulating layer made of a cured resin, which comprises the steps of:
    forming a capacitor;
    forming a barrier layer, from a non-conductive inorganic material having the same thermal expansion coefficient as that of the dielectric layer, on the capacitor; and
    forming at least one protective insulating layer on the barrier layer so that the capacitor and the protective insulating layer is separated from the barrier layer.

11. A process for production of a thin layer capacitor element comprising the steps of:
    forming a capacitor with a dielectric layer, from a metal oxide, on a substrate;
    forming a barrier layer, from a non-conductive inorganic material having the same thermal expansion coefficient as that of the dielectric layer, to cover at least the top and side of the capacitor; and
    forming at least one protective insulating layer, from a cured resin, on the barrier layer so that the capacitor and the protective insulating layer is separated from the barrier layer.

12. A process for production of a thin layer capacitor as described in claim 10 or 11, which further comprises the step of forming the dielectric layer by a sputtering method.

* * * * *